US010937920B2

(12) United States Patent
Ishida et al.

(10) Patent No.: US 10,937,920 B2
(45) Date of Patent: Mar. 2, 2021

(54) OPTICAL SENSOR

(71) Applicant: HAMAMATSU PHOTONICS K.K., Hamamatsu (JP)

(72) Inventors: Atsushi Ishida, Hamamatsu (JP); Takashi Baba, Hamamatsu (JP); Terumasa Nagano, Hamamatsu (JP); Noburo Hosokawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/323,810

(22) PCT Filed: Nov. 9, 2017

(86) PCT No.: PCT/JP2017/040444

§ 371 (c)(1),
(2) Date: Feb. 7, 2019

(87) PCT Pub. No.: WO2018/088480

PCT Pub. Date: May 17, 2018

(65) Prior Publication Data

US 2019/0172965 A1 Jun. 6, 2019

(30) Foreign Application Priority Data

Nov. 11, 2016 (JP) ............................ JP2016-220777

(51) Int. Cl.
*H01L 31/107* (2006.01)
*H01L 27/144* (2006.01)
(Continued)

(52) U.S. Cl.
CPC ........ *H01L 31/107* (2013.01); *H01L 27/1446* (2013.01); *H01L 27/14643* (2013.01);
(Continued)

(58) Field of Classification Search
CPC ........... H01L 27/1446; H01L 27/14643; H01L 27/14636; H01L 31/107; H01L 31/022408; H01L 31/02005; H01L 31/02027
See application file for complete search history.

(56) References Cited

U.S. PATENT DOCUMENTS 6,995,444 B2 * 2/2006 Cova ................ H01L 27/14643 257/438
9,748,428 B2 * 8/2017 Nagano ................ H01L 27/144
(Continued)

FOREIGN PATENT DOCUMENTS

JP 2003-530701 A 10/2003
JP 2013-89919 A 5/2013
(Continued)

OTHER PUBLICATIONS

International Preliminary Report on Patentability (IPRP) dated May 23, 2019 that issued in WO Patent Application No. PCT/JP2017/040444.
(Continued)

*Primary Examiner* — Joseph C. Nicely
(74) *Attorney, Agent, or Firm* — Faegre Drinker Biddle & Reath LLP

(57) ABSTRACT

A photodetecting device includes a semiconductor substrate including a first principal surface and a second principal surface that oppose each other and a plurality of through-electrodes penetrating through the semiconductor substrate in a thickness direction. The semiconductor substrate includes a plurality of avalanche photodiodes arranged to operate in Geiger mode. The plurality of through-electrodes are electrically connected to the corresponding avalanche photodiodes. The semiconductor substrate includes a first area in which the plurality of avalanche photodiodes are distributed in at least a first direction and a second area in
(Continued)

which the plurality of through-electrodes are distributed two-dimensionally. The first area and the second area are distributed in a second direction orthogonal to a first direction when viewed from a direction orthogonal to the first principal surface.

30 Claims, 12 Drawing Sheets

(51) Int. Cl.
*H01L 31/0224* (2006.01)
*H01L 27/146* (2006.01)
*H01L 31/02* (2006.01)

(52) U.S. Cl.
CPC .................. *H01L 31/02027* (2013.01); *H01L 31/022408* (2013.01); *H01L 27/14636* (2013.01)

(56) References Cited

U.S. PATENT DOCUMENTS

| | | | | |
|---|---|---|---|---|
| 10,224,437 | B2 * | 3/2019 | Kamakura | G01J 1/02 |
| 2014/0183684 | A1 | 7/2014 | Sadygov et al. | |
| 2014/0291486 | A1 * | 10/2014 | Nagano | H01L 31/107 250/208.2 |
| 2016/0181293 | A1 | 6/2016 | McGarvey et al. | |
| 2016/0329455 | A1 | 11/2016 | Nagano et al. | |
| 2019/0334050 | A1 * | 10/2019 | Nakamura | H01L 31/02 |
| 2020/0091208 | A1 * | 3/2020 | Otake | H01L 27/14609 |

FOREIGN PATENT DOCUMENTS

| | | | |
|---|---|---|---|
| JP | 2016-154260 | A | 8/2016 |
| JP | 2016-174129 | A | 9/2016 |
| WO | WO-01/78153 | A2 | 10/2001 |
| WO | WO 2013/058003 | A1 | 4/2013 |

OTHER PUBLICATIONS

European Search Report dated Mar. 18, 2020 issued in EP Patent Application No. 17870618.0.

* cited by examiner

OPTICAL SENSOR

TECHNICAL FIELD

The present invention relates to a photodetecting device.

BACKGROUND ART

Known photodetecting devices include a semiconductor substrate having a first principal surface and a second principal surface that oppose each other and a plurality of through-electrodes penetrating through the semiconductor substrate in a thickness direction (see, for example, Patent Literature 1). The semiconductor substrate includes a plurality of avalanche photodiodes arranged to operate in Geiger mode. The plurality of through-electrodes are electrically connected with the corresponding avalanche photodiodes.

CITATION LIST

Patent Literature

Patent Literature 1: Japanese Unexamined Patent Publication No. 2013-89919

SUMMARY OF INVENTION

Technical Problem

An object of an aspect of the present invention is to provide a photodetecting device in which photodetection accuracy is ensured and photodetection resolution is improved.

Solution to Problem

As a result of researches and studies, the present inventors have newly found the following facts.

In a photodetecting device including a plurality of pixels, the size of each pixel may be reduced and the pitch between pixels may also be reduced in order to improve the photodetection resolution. The smaller the size of each pixel is, the lower the photosensitivity of the pixel is. Therefore, if the pitch between pixels is reduced, the photodetection accuracy may decrease. It is difficult to achieve both the photodetection accuracy and an improvement of the photodetection resolution.

In order to ensure the photosensitivity, each pixel includes an avalanche photodiode arranged to operate in Geiger mode. Avalanche photodiodes arranged to operate in Geiger mode has a much higher photosensitivity than generally-available photodiodes having the same pixel size because a reverse voltage equal to or more than the breakdown voltage is applied to the avalanche photodiode.

When a through-electrode is used to read a signal from an avalanche photodiode, the pitch between pixels is limited because the arrangement area for the through-electrode provided for each pixel is required in the semiconductor substrate. Therefore, the photodetection resolution is difficult to improve. In a case where a bonding wire is used to read a signal from an avalanche photodiode, the following problems may occur if the pitch between pixels is small. Due to physical constraints of wire arrangement and generation of parasitic capacitance between wires, time responsiveness may decrease and noise may be generated. The decrease of the time responsiveness and the generation of the noise will result in a reduction of the photodetection accuracy.

The present inventors keenly studied a configuration in which the photodetection accuracy is ensured, and the photodetection resolution is improved.

The present inventors have found the following configuration. A semiconductor substrate includes a first area in which the plurality of avalanche photodiodes are distributed in at least a first direction and a second area in which the plurality of through-electrodes are distributed two-dimensionally. The first area and the second area are distributed in a second direction orthogonal to a first direction when viewed from the direction orthogonal to a first principal surface.

In the above configuration, the first area and the second area are disposed separately, and therefore, the pitch between pixels formed by the avalanche photodiodes is reduced without considering an distribution region of the through-electrodes. Since the pitch between pixels is reduced, the photodetection resolution is improved. Each pixel includes avalanche photodiodes, and a through-electrode is used to read a signal from each avalanche photodiode, so that the photosensitivity is ensured, and in addition, ensuring time responsiveness and suppression of noise is realized. Therefore, in the above configuration, the photodetection accuracy is ensured, and the photodetection resolution is improved.

An aspect of the present invention is a photodetecting device including a semiconductor substrate and a plurality of through-electrodes penetrating through the semiconductor substrate in a thickness direction. The semiconductor substrate includes a first principal surface and a second principal surface that oppose each other, and includes a plurality of avalanche photodiodes arranged to operate in Geiger mode. The plurality of through-electrodes are electrically connected to corresponding avalanche photodiodes of the plurality of avalanche photodiodes. The semiconductor substrate includes a first area in which the plurality of avalanche photodiodes are distributed in at least a first direction and a second area in which the plurality of through-electrodes are distributed two-dimensionally. The first area and the second area form a line in a second direction orthogonal to a first direction when viewed from a direction orthogonal to the first principal surface.

In the photodetecting device according to the aspect, the semiconductor substrate includes the first area and the second area, and the first area and the second area are form a line in the second direction orthogonal to the first direction. Therefore, in the aspect, the photodetection accuracy is ensured, and the photodetection resolution is improved.

In the photodetecting device according to the aspect, avalanche photodiodes of the plurality of avalanche photodiodes whose positions in the first direction are different from each other may be electrically connected to through-electrodes different from each other. In which case, a through-electrode is provided for each avalanche photodiode distributed in the first direction. Therefore, the pitch of the avalanche photodiodes in the first direction is narrowed, so that the photodetection resolution in the first direction can be further improved.

In the photodetecting device according to the aspect, the first area may have a rectangular shape of which a longitudinal direction is in the first direction. The plurality of avalanche photodiodes may be two-dimensionally distributed in the first area. In which case, the pixels extend in the second direction, so that the photosensitivity of each pixel is improved. Therefore, in this embodiment, the photodetection resolution in the first direction is further improved.

In the photodetecting device according to the aspect, the plurality of the avalanche photodiodes may form a plurality of pixels distributed in a line in the first direction. The plurality of avalanche photodiodes included in the same pixel may be electrically connected to the same through-electrode.

In the photodetecting device according to the aspect, the plurality of avalanche photodiodes may be distributed in a line in the first direction. In which case, the plurality of avalanche photodiodes are not distributed in a direction orthogonal to the first direction, so that photodetection of background light is suppressed. Therefore, in this embodiment, the dark count rate resulting from the photodetection of the background light is reduced, so that the photodetection accuracy is easily ensured.

In the photodetecting device according to the aspect, the semiconductor substrate may be formed with a plurality of through-holes in which the plurality of through-electrodes are provided. A pitch of the avalanche photodiodes may be smaller than a diameter of an opening of the through-holes at the first principal surface. In which case, since the pitch of the avalanche photodiodes is smaller than the diameter of the opening of the through-holes, and therefore, in this embodiment, the photodetection resolution is improved.

In the photodetecting device according to the aspect, the second area may include a third area and a fourth area spaced apart from each other in the second direction. The first area may be located between the third area and the fourth area. The plurality of through-electrodes may include a plurality of first through-electrodes located in the third area and a plurality of second through-electrodes located in the fourth area. In which case, the second area is divided into the third area and the fourth area located at either side of the second direction of the first area, so that arrangement density of wirings connecting the through-electrodes and the avalanche photodiodes is small, as compared with in a configuration in which the second area is not divided into the third area and the fourth area. Therefore, even if the pitch between the pixels is further reduced, generation of parasitic capacitance between the adjacent wirings is suppressed. Consequently, in this embodiment, the photodetection accuracy is ensured, and the photodetection resolution in the first direction is further improved.

In a photodetecting device according to the aspect, the plurality of first through-electrodes may be distributed in a matrix in which the first direction is a row direction and the second direction is a column direction when viewed from a direction orthogonal to the first principal surface. The plurality of second through-electrodes may be distributed in a matrix in which the first direction is a row direction and the second direction is a column direction when viewed from a direction orthogonal to the first principal surface. A column of the plurality of first through-electrodes and a column of the plurality of second through-electrodes may be located on a straight line. In which case, the column of the plurality of first through-electrodes in the third area and the column of the plurality of second through-electrodes in the fourth area are not deviated from each other, so that it is easy to form the through-holes in which the through-electrodes are provided. Therefore, in this embodiment, the photodetecting device in which the photodetection accuracy is ensured and the photodetection resolution is improved is easily realized.

In the photodetecting device according to the aspect, the first area may include a fifth area and a sixth area adjacent to each other in the first direction. The plurality of avalanche photodiodes may include a plurality of first avalanche photodiodes located in the fifth area and a plurality of second avalanche photodiodes located in the sixth area. The plurality of first through-electrodes and the plurality of second through-electrodes distributed on the straight line may be electrically connected to the plurality of first avalanche photodiodes and the plurality of second avalanche photodiodes, respectively. The first avalanche photodiode closer to one end of the first area in the first direction may be electrically connected to the first through-electrode farther from the first area. The second avalanche photodiode closer to the one end in the first direction may be electrically connected to the second through-electrode closer to the first area. When the difference in the lengths of the wirings is small between the avalanche photodiode and the through-electrode, between the two adjacent avalanche photodiodes, signal reading-time deviation between the adjacent avalanche photodiodes is small, as compared with when the difference in the lengths of the wirings is large. In this embodiment, the difference in lengths of the wirings is small, and therefore, for example, even when signals are read in order from the avalanche photodiode closest to one end of the first area, the signal reading-time deviation is small between two avalanche photodiodes adjacent to each other in the first direction. When the signals are read in order from the avalanche photodiodes in the first direction, this will make it easy to perform processing in a stage downstream of the photodetecting device.

In the photodetecting device according to the aspect, the avalanche photodiode electrically connected to the first through-electrode and the avalanche photodiode electrically connected to the second through-electrode may be distributed alternately in the first direction. In which case, the distance in the first direction between the wirings connecting the avalanche photodiodes and the through-electrodes are increased, so that the arrangement density of the wirings decreases. Therefore, even when the pitch between pixels is still smaller, the generation of parasitic capacitance between the adjacent wirings is suppressed. Consequently, according to this embodiment, the photodetecting device in which the photodetection accuracy is ensured and the photodetection resolution is further improved is provided.

In the photodetecting device according to the aspect, the plurality of first through-electrodes may be distributed in a matrix in which the first direction is a row direction and the second direction is a column direction when viewed from a direction orthogonal to the first principal surface. The plurality of second through-electrodes may be distributed in a matrix in which the first direction is a row direction and the second direction is a column direction when viewed from a direction orthogonal to the first principal surface. The first area may include a fifth area and a sixth area adjacent to each other in the first direction. The plurality of avalanche photodiodes may include a plurality of first avalanche photodiodes located in the fifth area and a plurality of second avalanche photodiodes located in the sixth area. The plurality of first avalanche photodiodes may be each electrically connected to the plurality of first through-electrodes distributed in the column direction, and may be arranged such that the first avalanche photodiode closer to one end of the first area in the first direction may be electrically connected to the first through-electrode farther from the first area. The plurality of second avalanche photodiodes may be each electrically connected to the plurality of second through-electrodes distributed in the column direction, and may be arranged such that the second avalanche photodiode closer to the one end in the first direction is electrically connected to the second through-electrode farther from the first area. In which case, a change of the length of the wiring between the first avalanche photodiode and the first through-electrode in accordance with the position of the first avalanche photodiode in the first direction and a change of the length of the wiring between the second avalanche photodiode and the second through-electrode in accordance with the position of the second avalanche photodiode in the first direction are similar to each other.

The photodetecting device according to the aspect may further include a plurality of first wirings in a straight line form and a plurality of second wirings in a straight line form. The plurality of first wirings electrically connect the plurality of first through-electrodes and the corresponding avalanche photodiodes. The plurality of second wirings electrically connect the plurality of second through-electrodes and the corresponding avalanche photodiodes. When a pitch in the first direction of the plurality of first through-electrodes and a pitch in the first direction of the plurality of second through-electrodes are a predetermined value, the pitch in the first direction of the plurality of avalanche photodiodes may be equal to or less than ½ of the predetermined value. The avalanche photodiode electrically connected to the first through-electrode and the avalanche photodiode electrically connected to the second through-electrode may be alternately distributed. In which case, the distance in the first direction between the first wirings and the distance in the first direction between the second wirings are increased, so that the arrangement density of the first wirings and the second wirings decreases. Therefore, even when the pitch between pixels is still smaller, the generation of parasitic capacitance between the adjacent wirings is suppressed. Consequently, according to this embodiment, the photodetecting device in which the photodetection accuracy is ensured and the photodetection resolution is further improved is provided.

The photodetecting device according to the aspect may further include a plurality of wirings connecting the plurality of through-electrodes and the plurality of avalanche photodiodes. The lengths of the plurality of wirings may be equivalent. In which case, signal reading-time deviation is extremely small between the plurality of avalanche photodiodes. Therefore, in this embodiment, it is easy to perform processing in a stage downstream of the photodetecting device.

The photodetecting device according to the aspect may further include a mounting substrate opposing the second principal surface of the semiconductor substrate and a plurality of bump electrodes. The mounting substrate may be electrically connected to the plurality of through-electrodes through the corresponding bump electrodes. In this embodiment, time responsiveness is improved and generation of noise is suppressed, for example, as compared with in a configuration in which the mounting substrate and the plurality of through-electrodes are electrically connected via bonding wires. Therefore, in this embodiment, the photodetection accuracy is easily ensured.

The photodetecting device according to the aspect may further include a mounting substrate opposing the second principal surface of the semiconductor substrate. The mounting substrate may include a plurality of quenching circuits. The plurality of avalanche photodiodes may be electrically connected to the corresponding quenching circuits. In this embodiment, the quenching circuits are provided on the mounting substrate, and therefore, the photodetecting device has a larger area in which the wirings are disposed and has a small arrangement density of the wirings, as compared with a configuration in which the quenching circuits are provided on the semiconductor substrate. Therefore, even when the pitch between pixels is still smaller, the generation of parasitic capacitance between the adjacent wirings is suppressed. Consequently, according to this embodiment, the photodetecting device in which the photodetection accuracy is ensured and the photodetection resolution is further improved is provided.

Advantageous Effects of Invention

An aspect of the present invention provides a photodetecting device in which photodetection accuracy is ensured and photodetection resolution is improved.

DESCRIPTION OF EMBODIMENTS

Figure 1:
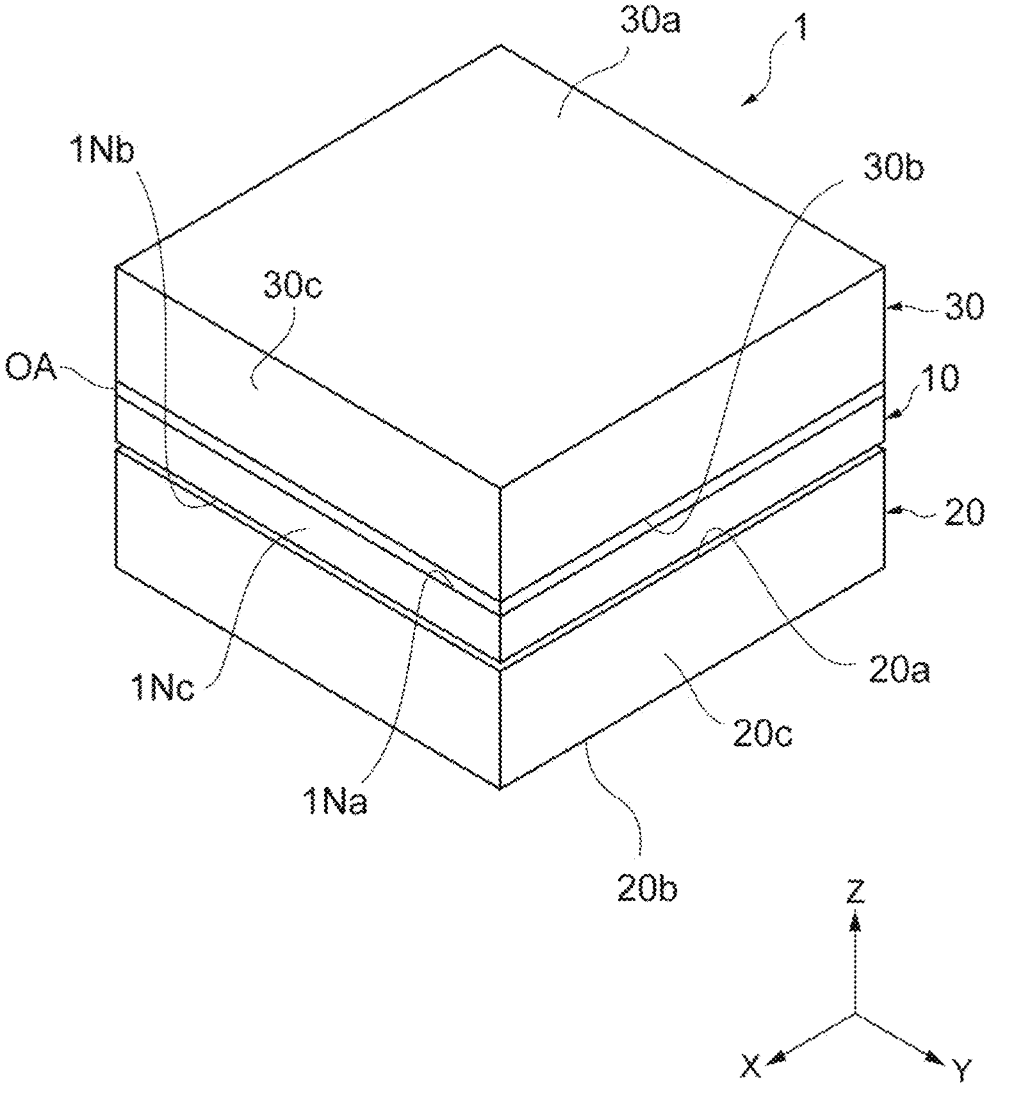
FIG. 1 is a schematic perspective view illustrating a photodetecting device according to an embodiment.

Embodiments of the present invention will be hereinafter described in detail with reference to the accompanying drawings. In the description, the same reference numerals are used for the same elements or elements having the same functions, and redundant descriptions thereabout are omitted.

Figure 2:
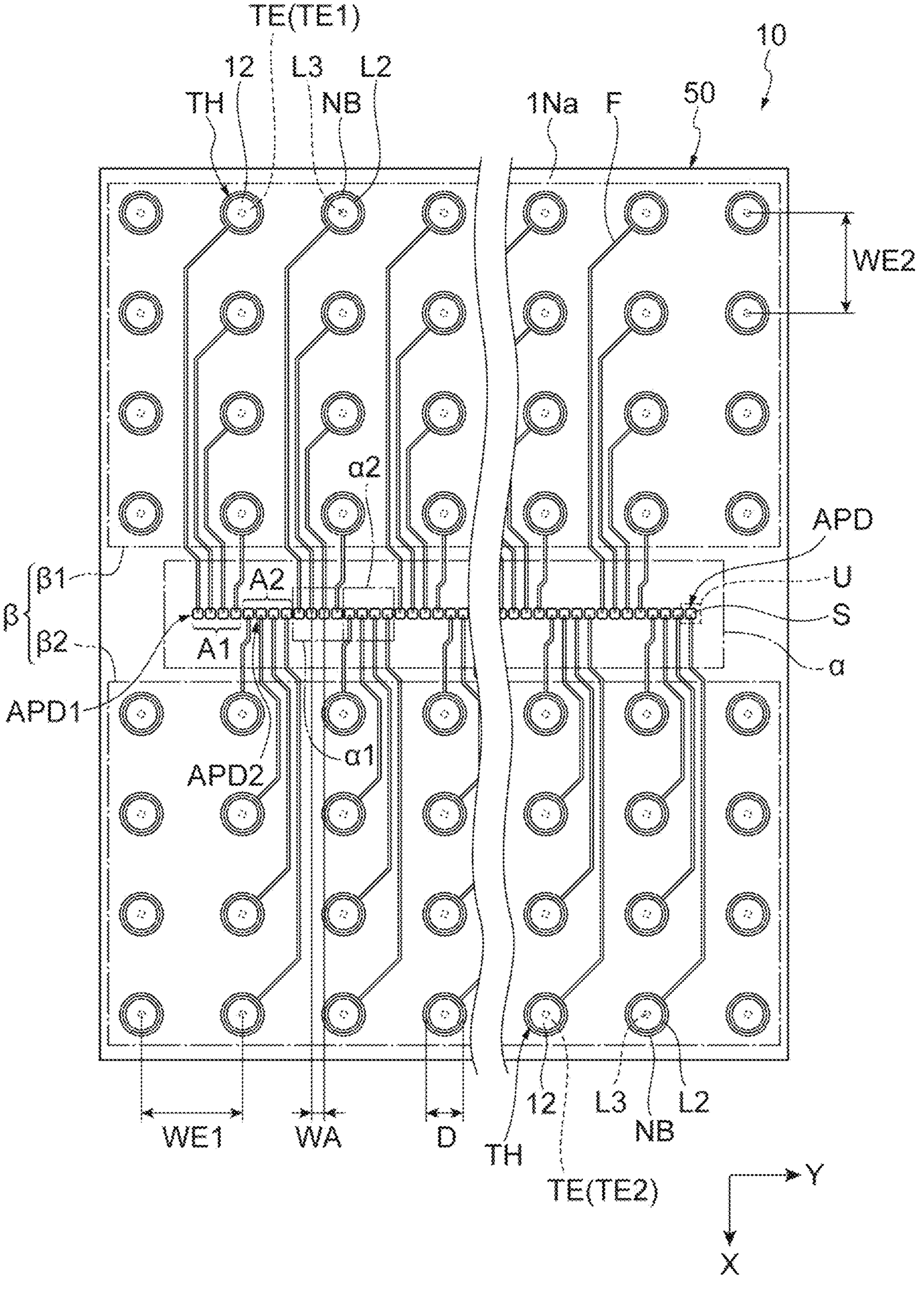
FIG. 2 is a schematic plan view illustrating a semiconductor photodetecting element.
Figure 3:
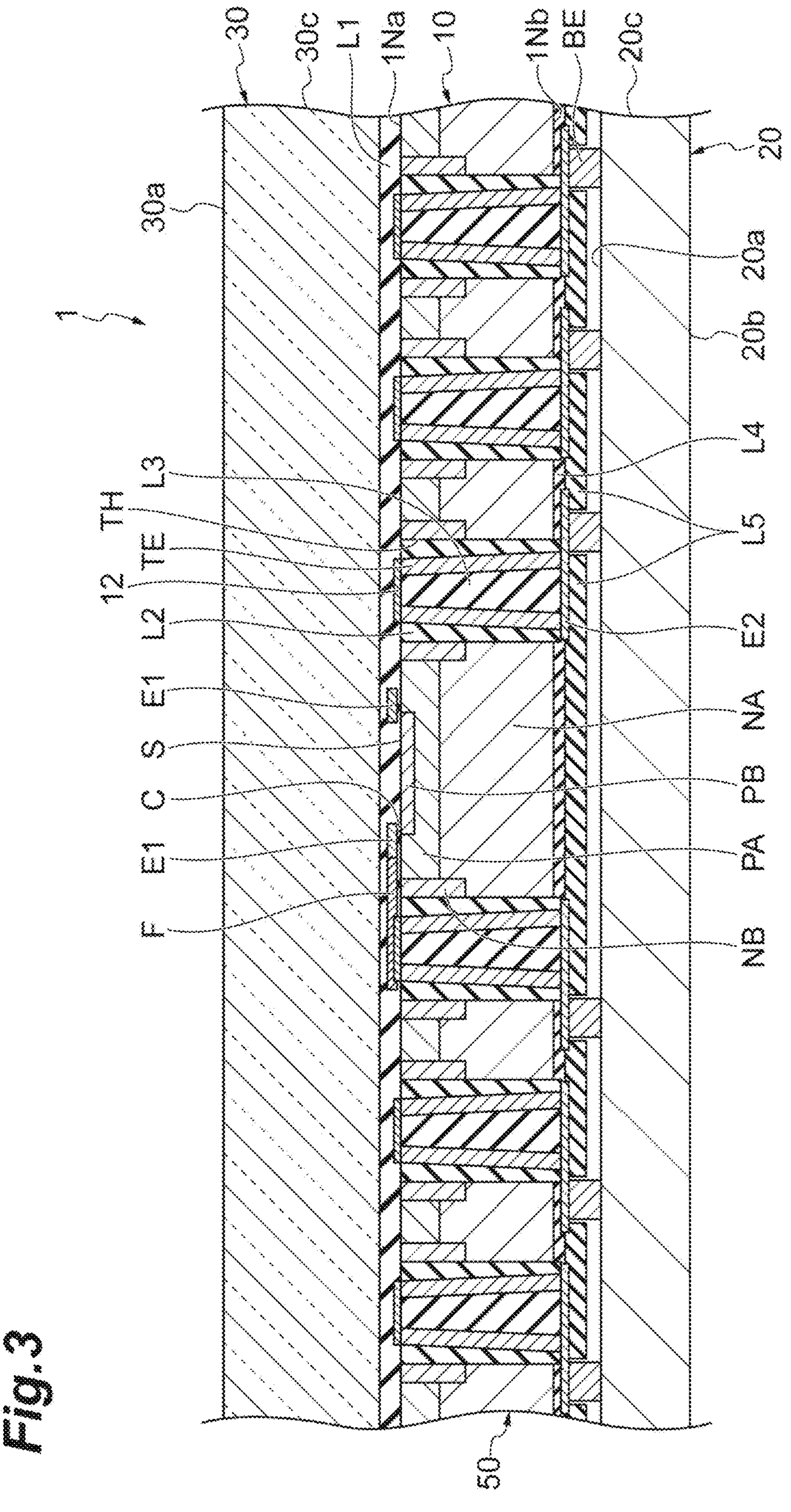
FIG. 3 is a diagram for describing a cross-sectional configuration of the semiconductor photodetecting element.
Figure 4:
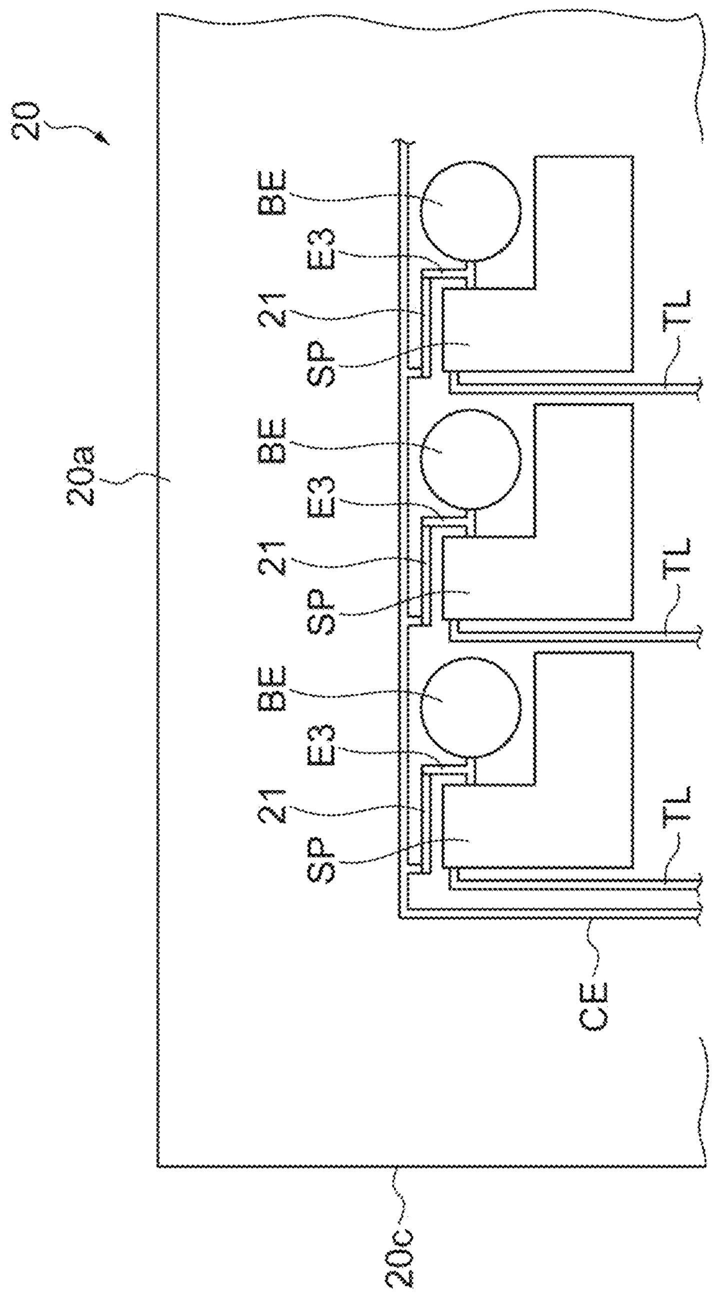
FIG. 4 is a schematic plan view illustrating a mounting substrate.

First, a configuration of a photodetecting device 1 according to the present embodiment will be described with reference to FIG. 1 to FIG. 4. FIG. 1 is a schematic perspective view illustrating the photodetecting device according to the present embodiment. FIG. 2 is a schematic plan view illustrating a semiconductor photodetecting element. FIG. 3 is a diagram for describing a cross-sectional configuration of the semiconductor photodetecting element. FIG. 4 is a schematic plan view illustrating a mounting substrate.

As illustrated in FIG. 1, the photodetecting device 1 includes a semiconductor photodetecting element 10, a mounting substrate 20, and a glass substrate 30. The mounting substrate 20 opposes the semiconductor photodetecting element 10. The glass substrate 30 opposes the semiconductor photodetecting element 10. The semiconductor photodetecting element 10 is disposed between the mounting substrate 20 and the glass substrate 30. In the present embodiment, a plane in parallel with each principal surface of the semiconductor photodetecting element 10, the mounting substrate 20, and the glass substrate 30 is XY-axis plane, and a direction orthogonal to each principal surface is Z-axis direction.

The semiconductor photodetecting element 10 includes a semiconductor substrate 50 having a rectangular shape in a plan view. The semiconductor substrate 50 is made of Si and is an N type semiconductor substrate. The semiconductor substrate 50 includes a principal surface 1Na and a principal surface 1Nb that oppose each other.

The glass substrate 30 includes a principal surface 30*a* and a principal surface 30*b* that oppose each other. The glass substrate 30 has a rectangular shape in a plan view. The principal surface 30*b* opposes the principal surface 1Na of the semiconductor substrate 50. The principal surface 30*a* and the principal surface 30*b* are flat. The glass substrate 30 and the semiconductor photodetecting element 10 are optically connected by an optical adhesive OA. The glass substrate 30 may be formed directly on the semiconductor photodetecting element 10.

A scintillator (not illustrated) may be optically connected to the principal surface 30*a* of the glass substrate 30. In which case, the scintillator is connected to the principal surface 30*a* by an optical adhesive. The scintillation light from the scintillator passes through the glass substrate 30 and is incident on the semiconductor photodetecting element 10.

The mounting substrate 20 includes a principal surface 20*a* and a principal surface 20*b* that oppose each other. The mounting substrate 20 has a rectangular shape in a plan view. The principal surface 20*a* opposes the principal surface 1Nb of the semiconductor substrate 50. The mounting substrate 20 includes a plurality of electrodes disposed on the principal surface 20*a*.

A side surface 1Nc of the semiconductor substrate 50, a side surface 30*c* of the glass substrate 30, and a side surface 20*c* of the mounting substrate 20 are flush with each other. That is, in the plan view, an outer edge of the semiconductor substrate 50, an outer edge of the glass substrate 30, and an outer edge of the mounting substrate 20 match each other. The outer edge of the semiconductor substrate 50, the outer edge of the glass substrate 30, and the outer edge of the mounting substrate 20 do not have to match each other. For example, in the plan view, the area of the mounting substrate 20 may be larger than the area of each of the semiconductor substrate 50 and the glass substrate 30. In which case, the side surface 20*c* of the mounting substrate 20 is located outside, in the XY-axis plane direction, of the side surface 1Nc of the semiconductor substrate 50 and the side surface 30*c* of the glass substrate 30.

Next, the structure of the semiconductor photodetecting element 10A will be described with reference to FIG. 2. FIG. 2 is a view illustrating the semiconductor photodetecting element 10 that is viewed from the direction orthogonal to the principal surface 1Na of the semiconductor substrate 50 (Z-axis direction).

As illustrated in FIG. 2, the semiconductor photodetecting element 10 has a plurality of avalanche photodiodes APD and a plurality of through-electrodes TE, and a plurality of wirings F. Each avalanche photodiode APD is arranged to operate in Geiger mode. The plurality of through-electrodes TE are electrically connected to the corresponding avalanche photodiodes APD. Each of the plurality of wirings F electrically connects the avalanche photodiode APD and the through-electrode TE that correspond to each other. Each wiring F is provided on the principal surface 1Na. Each wiring F is formed on the principal surface 1Na with an insulating layer L1 interposed therebetween.

Each avalanche photodiode APD includes a single light receiving region S. In the present embodiment, the light receiving region S of each avalanche photodiode APD forms one pixel U in the semiconductor photodetecting element 10. The light receiving region S of each avalanche photodiode APD is electrically connected to the through-electrode TE in a one-to-one relationship. For each avalanche photodiode APD, a through-electrode TE is provided. In the present embodiment, the light receiving regions S are substantially square when viewed from the Z-axis direction. From the perspective of ensuring the size of the light receiving region, the light receiving region S may be a rectangular shape or an elliptical shape of longitudinal direction in the X-axis direction. The light receiving region S1 is a charge generating region (a photosensitive region) configured to generate charges in response to incident light. That is, the light receiving region S1 is a photodetecting region.

The semiconductor substrate 50 includes a first area α and a second area β. The first area α and the second area β form a line in the X-axis direction orthogonal to the Y axis direction when viewed from the Z axis direction. In the first area α, the plurality of avalanche photodiodes APD are distributed at least in the Y axis direction. In the present embodiment, the plurality of avalanche photodiodes APD are distributed only in the Y axis direction. In the second area β, a plurality of through-electrodes TE are two-dimensionally distributed.

The second area β includes an area β1 and an area β2. The area β1 and the area β2 are separated in the X-axis direction. The first area α is located between the area β1 and the area β2. In the X-axis direction, the area β1, the first area α, and the area β2 are arranged in this order. The first area α, the area β1, and the area β2 have rectangular shapes of which longitudinal direction is in the Y axis direction. There are no avalanche photodiodes APD provided in the area β1 nor the area β2.

A plurality of through-holes TH penetrating through the semiconductor substrate 50 in the Z axis direction are formed in the second area β of the semiconductor substrate 50. In the present embodiment, a plurality of through-holes TH are formed in the area β1 and a plurality of through-holes TH are formed in the area β2. The Z axis direction is the thickness direction of the semiconductor substrate 50. Each of the plurality of through-electrodes TE is provided in the corresponding through-hole TH. The plurality of through-electrodes TE include a plurality of through-electrodes TE1 located in the area β1 and a plurality of through-electrodes TE2 located in the area β2. The opening of each of the through-holes TH has a circular shape when viewed from the Z axis direction. The opening of the through-holes TH in the cross section parallel to the XY axis plane is also in a circular shape. The diameter D of the opening of the through-holes TH at the principal surface 1Na is, for example, 30 μm. The shape of the opening of the through-hole TH may not be circular, but may instead be a polygonal shape.

In each of the area β1 and the area β2, the plurality of through-electrodes TE (the centers of the openings of the plurality of through-holes TH) are distributed in a matrix when viewed from the Z axis direction. That is, the plurality of through-electrodes TE1 are distributed in a matrix when viewed from the Z axis direction, and the plurality of through-electrodes TE2 are distributed in a matrix when viewed from the Z axis direction. In the present embodiment, the pitch WE1 in the row direction of the through-electrode and the pitch WE2 in the column direction of the through-electrode TE are the same as each other. Each of the pitch WE1 and the pitch WE2 is, for example, 100 μm. The row direction is the Y axis direction and the column direction is the X-axis direction.

A column in which the plurality of through-electrodes TE1 (through-holes TH) are distributed and a column in which the plurality of through-electrodes TE2 (through-holes TH) are distributed are positioned on the same straight line. The plurality of through-electrodes TE2 (through-holes TH) are located on the extension line of the column formed by the plurality of through-electrodes TE1 (through-holes TH).

The pitch WA in the Y axis direction of the avalanche photodiodes APD is less than the diameter D of the opening of the through-hole TH. If the shape of the opening of the through-hole TH is a polygonal shape, the pitch WA is smaller than the diameter of a circle inscribed in the polygon shape. The pitch WA is, for example, 12.5 μm. The plurality of avalanche photodiodes APD are distributed in a line in the Y axis direction when viewed from the Z axis direction in the first area α. That is, the plurality of avalanche photodiodes APD are one-dimensionally distributed in the Y axis direction.

The avalanche photodiodes APD whose positions in the Y axis direction are different from each other are electrically connected to through-electrodes TE different from each other (TE1 or TE2). Each of the plurality of avalanche photodiodes APD is electrically connected to a different through-electrode TE (TE1 or TE2) depending on the position in the Y axis direction.

The plurality of avalanche photodiodes APD includes a plurality of avalanche photodiodes APD1 and a plurality of avalanche photodiodes APD2. The first area α includes areas α1 and α2 adjacent to each other in the Y axis direction. The plurality of avalanche photodiodes APD1 are located in the area α1. The plurality of avalanche photodiodes APD2 are located in the area α2. In the present embodiment, the first area α includes a plurality of areas α1 and a plurality of areas α2. The plurality of areas α1 and the plurality of areas α2 are alternately positioned in the Y axis direction. The plurality of avalanche photodiodes APD1 located in any given area α1 form one avalanche photodiode group A1. The plurality of avalanche photodiodes APD2 located in any given area α2 form one avalanche photodiode group A2. The avalanche photodiode group A1 and the avalanche photodiode group A2 are adjacent to each other in the Y axis direction. In the present embodiment, the plurality of avalanche photodiode groups A1 and the plurality of avalanche photodiode groups A2 are alternately located in the Y axis direction. Each of the plurality of avalanche photodiodes APD1 is electrically connected to a corresponding through-electrode TE1. Each of the plurality of avalanche photodiodes APD2 is electrically connected to a corresponding through-electrode TE2. A plurality of through-electrodes TE1 and a plurality of through-electrodes TE2 distributed on the straight line are electrically connected to a plurality of avalanche photodiodes APD1 located in any given area α1 and a plurality of avalanche photodiodes APD2 located in any given area α2, respectively. In the present embodiment, the number of avalanche photodiodes APD1 located in any given area α1 is "4" and the number of avalanche photodiodes APD2 located in any given area α2 is "4". The number of avalanche photodiodes APD1 located in any given area α1 and the number of avalanche photodiodes APD2 located in any given area α2 are the same as each other.

In any given avalanche photodiode group A1 (any given area α1), an avalanche photodiode APD1 closer to one end of the first area α in the Y axis direction is electrically connected to a through-electrode TE (TE1) farther from the first area α (area α1). In other words, in any given avalanche photodiode group A1, the closer to the one end of the first area α (area α1) a given avalanche photodiode APD1 is located, the farther from the first area α (area α1) the through-electrode TE (TE1) to which the given avalanche photodiode APD1 is electrically connected.

In any given avalanche photodiode group A2 (any given area α2), an avalanche photodiode APD2 closer to one end of the first area α in the Y axis direction is electrically connected to a through-electrode TE (TE2) closer to the first area α (area α2). In other words, in any given avalanche photodiode group A2, the closer to the one end of the first area α (area α2) a given avalanche photodiode APD2 is located, the closer to the first area α (area α2) the through-electrode TE (TE2) to which the given avalanche photodiode APD2 is electrically connected.

Next, the configuration of the semiconductor photodetecting element 10 according to the present embodiment will be described with reference to FIG. 3.

As illustrated in FIG. 3, the semiconductor photodetecting element 10 includes an insulating layer L2 and an insulating layer L3. The insulating layer L2 is formed on an inner peripheral surface of the through-hole TH. The through-electrode TE is formed on the insulating layer L2. The through-electrode TE is provided in the through-hole TH with the insulating layer L2 interposed therebetween. The insulating layer L3 is formed on the through-electrode TE. The insulating layer L3 is provided in the space defined by the through-electrode TE. The insulating layer L3 is provided inside of the through-electrode TE. The insulating layer L2, the through-electrode TE, and the insulating layer L3 are provided inside of the of the through-hole TH in the following order: the insulating layer L2, the through-electrode TE, and the insulating layer L3, which are from the outer periphery to the center of the through-hole TH. In FIG. 3, the glass substrate 30 is formed directly on the semiconductor photodetecting element 10 without any optical adhesive OA interposed therebetween.

Each of the plurality of avalanche photodiodes APD includes a P-type first semiconductor region PA, an N-type second semiconductor region NA, and a P-type third semiconductor region PB. The first semiconductor region PA is located at the principal surface 1Na side of the semiconductor substrate 50. The second semiconductor region NA is located at the principal surface 1Nb side of the semiconductor substrate 50. The third semiconductor region PB is formed in the first semiconductor region PA. An impurity concentration of third semiconductor region PB is higher than an impurity concentration of first semiconductor region PA. The third semiconductor region PB is the light receiving region S. Each of the plurality of avalanche photodiodes APD is configured to include a $P^+$ layer serving as the third semiconductor region PB, a P layer serving as the first semiconductor region PA, and an $N^+$ layer serving as the second semiconductor region NA, which are arranged in this order from the principal surface 1Na. The semiconductor substrate 50 includes a plurality of avalanche photodiodes APD.

An edge of the through-hole TH is formed by the fourth semiconductor region NB and the second semiconductor region NA. The fourth semiconductor region NB and the third semiconductor region PB are spaced apart from each other. The fourth semiconductor region NB is located between the first semiconductor region PA and the insulating layer L2, and the first semiconductor region PA and the insulating layer L2 are spaced apart from each other. In the semiconductor substrate 50, a PN junction formed between the first semiconductor region PA and the second semiconductor region NA is not exposed to the through-hole TH because of the presence of the fourth semiconductor region NB.

Each of the plurality of avalanche photodiodes APD includes an electrode E1. The electrode E1 is disposed at the principal surface 1Na side of the semiconductor substrate 50. The electrode E1 is provided along the contour of the light receiving region S. The electrode E1 has a shape along the outer periphery of the light receiving region S. In the present embodiment, the electrode E1 has a rectangular ring shape. The electrode E1 includes a connected portion C extending in the Z axis direction. The connected portion C is electrically connected to the light receiving region S. The electrode E1 is connected to the wiring F, and electrically connects the light receiving region S to the wiring F. The electrode E1 is provided on the principal surface 1Na with the insulating layer L1 interposed therebetween. The electrode E1 is not in contact with the semiconductor substrate 50 in a portion other than the connected portion C.

The semiconductor photodetecting element 10 includes an electrode pad 12 and an electrode E2. The electrode pad 12 is located at the principal surface 1Na side of the semiconductor substrate 50. The electrode E2 is located at the principal surface 1Nb side of the semiconductor substrate 50. The electrode pad 12 and the electrode E2 are formed on each through-electrode TE. The electrode pad 12 is connected to the wiring F, and electrically connects the wiring F and the through-electrode TE. The electrode E2 is formed on the principal surface 1Nb with the insulating layer L4 interposed therebetween. One end of the electrode E2 is connected to the through-electrode TE, and another end of the electrode E2 is connected to the bump electrode BE. The electrode E2 is covered with an insulating layer L5 except for a portion connected to the bump electrode BE. The photodetecting device 1 includes the plurality of bump electrodes BE.

The electrodes E1, E2, the wiring F, the electrode pad 12, and the through-electrode TE are made of metal. The electrodes E1, E2, the wiring F, the electrode pad 12, and the through-electrode TE are made of, for example, aluminum (Al). When the semiconductor substrate is made of Si, copper (Cu) is used as an electrode material instead of aluminum. The electrodes E1, E2, the wiring F, the electrode pad 12, and the through-electrode TE may be integrally formed. The electrodes E1, E2, the wiring F, the electrode pad 12, and the through-electrode TE are formed, for example, by sputtering.

When Si is used for the material of the semiconductor substrate 50, Group-III element (for example, B) is used for P-type impurity and Group-V element (for example, P or As) is used for N-type impurity. Like the semiconductor photodetecting element 10, an element whose N-type and P-type, which are the conductivity-types of the semiconductor, are replaced with each other also functions as a semiconductor photodetecting element. For example, a diffusion method or an ion implantation method is used for the adding method of the impurity.

The insulating layers L1, L2, L3, L4, L5 are made of, for example, $SiO_2$, SiN, or resin. For example, a thermal oxidation method, a sputtering method, a CVD method, or a resin coating method is used for forming the insulating layers L1, L2, L3, L4, L5.

Since the electrode E1 and the electrode pad 12 are electrically connected through the wiring F, the avalanche photodiode APD is electrically connected to the through-electrode TE. The mounting substrate 20 is electrically connected to the through-electrode TE via the bump electrode BE. The signal output from the light receiving region S is led to the through-electrode TE through the electrode E1, the wiring F, and the electrode pad 12. The signal led to the through-electrode TE is led to the mounting substrate 20 through the electrode E2 and the bump electrode BE.

The bump electrode BE is formed on the electrode E2 with an under bump metal (UBM), not illustrated, interposed therebetween. The UBM is made of a material with excellent electrical and physical connection with the bump electrode BE. The UBM is formed by, for example, an electroless plating method. The bump electrode BE is formed by, for example, a method of mounting a solder ball or a printing method. The bump electrode BE is made of, for example, solder.

Next, the configuration of the mounting substrate 20 will be described with reference to FIG. 4.

As illustrated in FIG. 4, the mounting substrate 20 includes a plurality of electrodes E3, a plurality of quenching resistors 21, and a plurality of signal processing units SP. The mounting substrate 20 includes an ASIC (Application Specific Integrated Circuit). The quenching resistor 21 may be provided in the semiconductor photodetecting element 10 instead of the mounting substrate 20. In which case, one end of the quenching resistor 21 is electrically connected to the light receiving region S, and another end of the quenching resistor 21 is electrically connected to the through-electrode TE. The quenching resistors 21 are made of, for example, polysilicon, NiCr, or SiCr.

Each electrode E3 is provided at the principal surface 20*a* side of the mounting substrate 20. Each of the plurality of electrodes E3 is electrically connected to the corresponding bump electrodes BE. Like the electrodes E1 and E2, the electrode E3 is made of metal. The electrode E3 is made of, for example, aluminum. The material constituting the electrode E3 may be made of Cu instead of aluminum.

Each quenching resistor 21 is provided at the principal surface 20*a* side. The quenching resistor 21 includes a passive quenching circuit. One end of the quenching resistor 21 is electrically connected to the electrode E3. Each of the plurality of quenching resistors 21 is electrically connected in series with the corresponding avalanche photodiode APD. The other end of each of the plurality of quenching resistors 21 is connected to a common electrode CE. The plurality of quenching resistors 21 are electrically connected in parallel to the common electrode CE. The common electrode CE is, for example, connected to the ground potential. The mounting substrate 20 includes a plurality of active quenching circuits instead of the plurality of passive quenching circuits. Each of the active quenching circuits includes a transistor.

Each signal processing unit SP is located on the principal surface 20*a* side. An input terminal of the signal processing unit SP is electrically connected to the electrode E3 and an output terminal of the signal processing unit SP is connected to a signal line TL. Each signal processing unit SP receives an output signal from the corresponding avalanche photodiode APD (semiconductor photodetecting element 10) through the electrode E1, the through-electrode TE, the bump electrode BE, and the electrode E3. Each signal processing unit SP processes the output signal from the corresponding avalanche photodiode APD. Each signal processing unit SP includes an inverter 22 illustrated in FIG. 5.

A power supply terminal 22*a* of the inverter 22 is connected to a voltage source. An input terminal of the inverter 22 is electrically connected to the bump electrode BE. Each inverter 22 is electrically connected in parallel to the quenching resistor 21 and in series with the avalanche photodiode APD.

Figure 5:
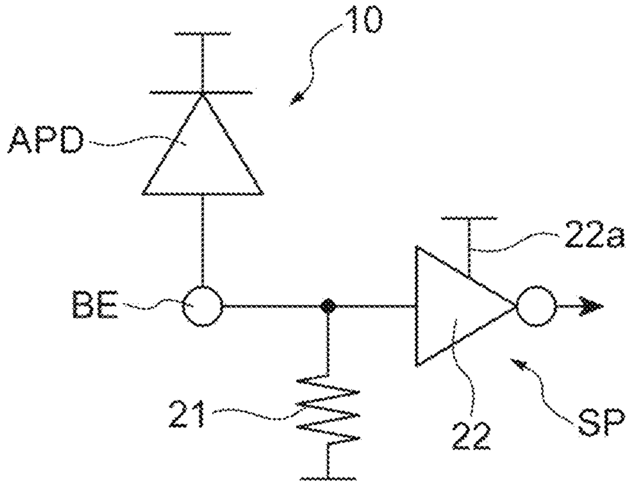
FIG. 5 is a circuit diagram of the photodetecting device.

Next, the operation of the photodetecting device 1 will be described with reference to FIG. 5. FIG. 5 is a circuit diagram of the photodetecting device.

In the semiconductor photodetecting element 10, each avalanche photodiode APD (APD1 and APD2) is arranged to operate in Geiger mode. In Geiger mode, a reverse voltage (reverse bias voltage) larger than the breakdown voltage of the avalanche photodiode APD is applied between the anode and the cathode of the avalanche photodiode APD. In the present embodiment, the anode is the first semiconductor region PA and the cathode is the second semiconductor region NA. The second semiconductor region NA is electrically connected to an electrode (not illustrated) provided on the back side of the semiconductor substrate 50. The first semiconductor region PA is electrically connected to the electrode E1 through the third semiconductor region PB. For example, a negative potential is applied to the first semiconductor region PA and a positive potential is applied to the second semiconductor region NA. The polarities of these potentials are relative to each other.

When light (photon) is incident upon the avalanche photodiode APD, photoelectric conversion is performed inside of the semiconductor substrate and photoelectrons are generated. At an area near the PN junction interface of the first semiconductor region PA, avalanche multiplication is performed, and the amplified electron group flows to the mounting substrate 20 through the electrode E1, the electrode pad 12, the through-electrode TE, and the bump electrode BE. When light (photon) is incident on any pixel U (light receiving region S) of the semiconductor photodetecting element 10, the generated photoelectrons are multiplied, and a signal generated by the multiplied photoelectrons is retrieved through the bump electrode BE and input into the corresponding inverter 22. The inverter 22 outputs the input signal as a digital pulse signal from the output terminal.

Figure 11:
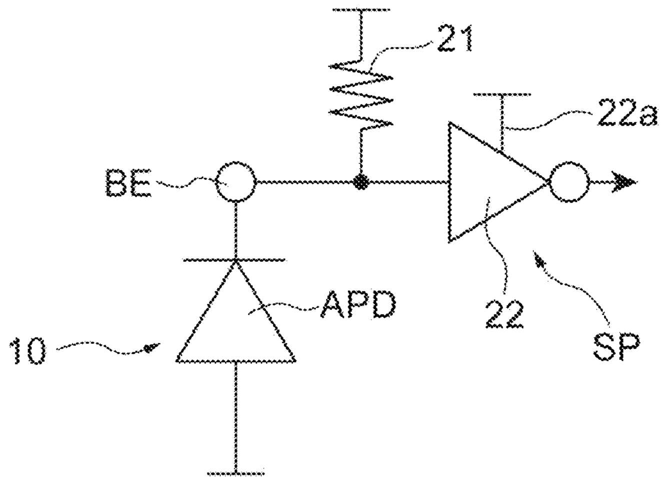
FIG. 11 is a circuit diagram of a photodetecting device according to a modification of the present embodiment.

In each avalanche photodiode APD, P-type and N-type which are the conductivity types of the semiconductor may be exchanged so as to be opposite to the above conductivity type, the photodetecting device 1 may have a circuit illustrated in FIG. 11. In which case, the polarities of the avalanche photodiode APD are inverted with respect to the through-electrode TE. One end of the quenching resistor 21 is electrically connected to the through-electrode TE (bump electrode BE) through the electrode E3. Another end of the quenching resistor 21 is electrically connected to a voltage source. The power supply terminal 22*a* of the inverter 22 is electrically connected to a voltage source. The input terminal of the inverter 22 is electrically connected to the bump electrode BE. The inverter 22 outputs a digital pulse signal from the output terminal according to the signal input to the input terminal.

As described above, in the photodetecting device 1, the semiconductor substrate 50 includes a first area α and a second area β when viewed from a direction orthogonal to the principal surface 1Na. The first area α and the second area β are aligned in the X-axis direction. Therefore, in the photodetecting device 1, photodetection accuracy is ensured, and photodetection resolution is improved.

The second area β and the first area α are separately provided, so that, for example, an area in which the through-electrodes TE are disposed is configured without being restricted by, e.g., the arrangement of the avalanche photodiodes APD. Therefore, even when the pitch WA of the avalanche photodiodes APD (pixels U) is small, the area where the through-electrodes TE are provided is sufficiently ensured. Consequently, in the photodetecting device 1, the requirement for miniaturization to form the through-electrode TE is relaxed, and there is a low possibility that a connection failure or insulation failure occurs in the through-electrode TE.

The avalanche photodiodes APD whose positions in the Y axis direction are different from each other are electrically connected to through-electrodes TE different from each other (TE1 or TE2). For each avalanche photodiode APD aligned in the Y axis direction, a through-electrode TE is provided. Therefore, the pitch WA of the avalanche photodiodes APD in the Y axis direction is narrowed, so that the photodetection resolution in the Y axis direction can be further improved.

The plurality of avalanche photodiodes APD (APD1 and APD2) are distributed in a line in the Y axis direction. In the photodetecting device 1, the plurality of avalanche photodiodes APD are not distributed in a direction orthogonal to Y axis direction, so that photodetection of background light is suppressed. Therefore, in the photodetecting device 1, the dark count rate resulting from the photodetection of the background light is reduced, so that the photodetection accuracy is easily ensured.

The pitch WA of the avalanche photodiodes APD is less than the diameter D of the opening of the through-hole TH on the principal surface 1Na. Therefore, in the photodetecting device 1, the photodetection resolution is improved.

The first area α is located between the area β1 and the area β2. In the photodetecting device 1, the second area β is divided into the area β1 and the area β2, and therefore, arrangement density of the wiring F in the photodetecting device is small, as compared with in a photodetecting device in which the second area β is not divided into the area β1 and the area β2. Therefore, even when the pitch WA of the avalanche photodiodes APD (pixels U) is further narrowed, generation of parasitic capacitance between the wirings F is suppressed. Therefore, in the photodetecting device 1, the photodetection accuracy is ensured, and the photodetection resolution is improved.

In the area β1, the plurality of through-electrodes TE1 are distributed in a matrix when viewed from the Z axis direction. In the area β2, the plurality of through-electrodes TE2 are distributed in a matrix when viewed from the Z axis direction. A column in which the plurality of through-electrodes TE1 are distributed and a column in which the plurality of through-electrodes TE2 are distributed are positioned on the same straight line. The column of the through-electrodes TE1 in the area β1 and the column of the through-electrodes TE2 in the area β2 do not deviate from each other, and therefore, it is easy to form the through-holes where the through-electrodes TE (TE1 and TE2) are provided. Therefore, a photodetecting device 1 in which the photodetection accuracy is ensured and the photodetection resolution is improved is easily realized.

The first area α includes the area α1 and the area α2. The plurality of avalanche photodiodes APD include the plurality of avalanche photodiodes APD1 located in area α1 and the plurality of avalanche photodiodes APD2 located in area α2. A plurality of through-electrodes TE1 and a plurality of through-electrodes TE2 distributed on the straight line are electrically connected to a plurality of avalanche photodiodes APD1 located in any given area α1 and a plurality of avalanche photodiodes APD2 located in any given area α2, respectively. In any given area α1, an avalanche photodiode APD1 closer to one end of the first area α in the Y axis direction is electrically connected to a through-electrode TE1 farther from the first area α. In other words, in any give area α1, the closer to the one end of the first area α in the Y axis direction a given avalanche photodiode APD1 is located, the farther from the first area α the through-electrode TE1 to which the given avalanche photodiode APD1 is electrically connected. In any given area α2, an avalanche photodiode APD2 closer to one end of the first area α in the Y axis direction is electrically connected to a through-electrode TE2 closer to the first area α. In other words, in any give area α2, the closer to the one end of the first area α in the Y-axis direction a given avalanche photodiode APD2 is located, the closer to the first area α the through-electrode TE2 to which the given avalanche photodiode APD2 is connected.

When the difference in the lengths of the wirings F electrically connected to two adjacent avalanche photodiodes APD is small between the two adjacent avalanche photodiodes APD, signal reading-time deviation between the adjacent avalanche photodiodes APD is small, as compared with when the difference in the lengths of the wirings F is large. In the photodetecting device 1, the difference in the lengths of the wirings F is small, and therefore, for example, even when signals are read out in order from the avalanche photodiode APD positioned closest to the first area α, the signal reading-time deviation is small between two avalanche photodiodes APD adjacent to each other in the Y axis direction. When the signals read from the avalanche photodiode APD are sequentially read out in Y axis direction, this will make it easy to perform processing in a stage downstream of the photodetecting device 1.

The mounting substrate 20 is electrically connected to the plurality of through-electrodes TE through the corresponding bump electrodes BE. In the photodetecting device 1, time responsiveness is improved and causes less generation of noise is suppressed, for example, as compared with in a photodetecting device in which the mounting substrate 20 and the plurality of through-electrodes TE are electrically connected via bonding wires. Therefore, in the photodetecting device 1, the photodetection accuracy is easily ensured.

The quenching resistor 21 is provided on the mounting substrate 20. For this reason, the photodetecting device 1 has a large area in which the wirings F are disposed and has a small arrangement density of the wirings F, as compared with a photodetecting device in which the quenching resistors 21 are provided on the semiconductor substrate 50. Therefore, even when the pitch WA of the avalanche photodiodes APD (pixels U) is even smaller, the generation of parasitic capacitance between the adjacent wirings F is suppressed. Consequently, according to the present embodiment, the photodetecting device 1 in which the photodetection accuracy is ensured and the photodetection resolution is further improved is provided.

Next, a configuration of a modification of the semiconductor photodetecting element 10 will be described with reference to FIG. 6 to FIG. 10. FIG. 6 to FIG. 10 are schematic plan views illustrating modifications of semiconductor photodetecting elements. FIG. 6 to FIG. 10 are views illustrating semiconductor photodetecting elements 10 when viewed from the Z axis direction. The photodetecting device 1 has one of the semiconductor photodetecting elements 10 illustrated in FIG. 6 to FIG. 10.

Figure 6:
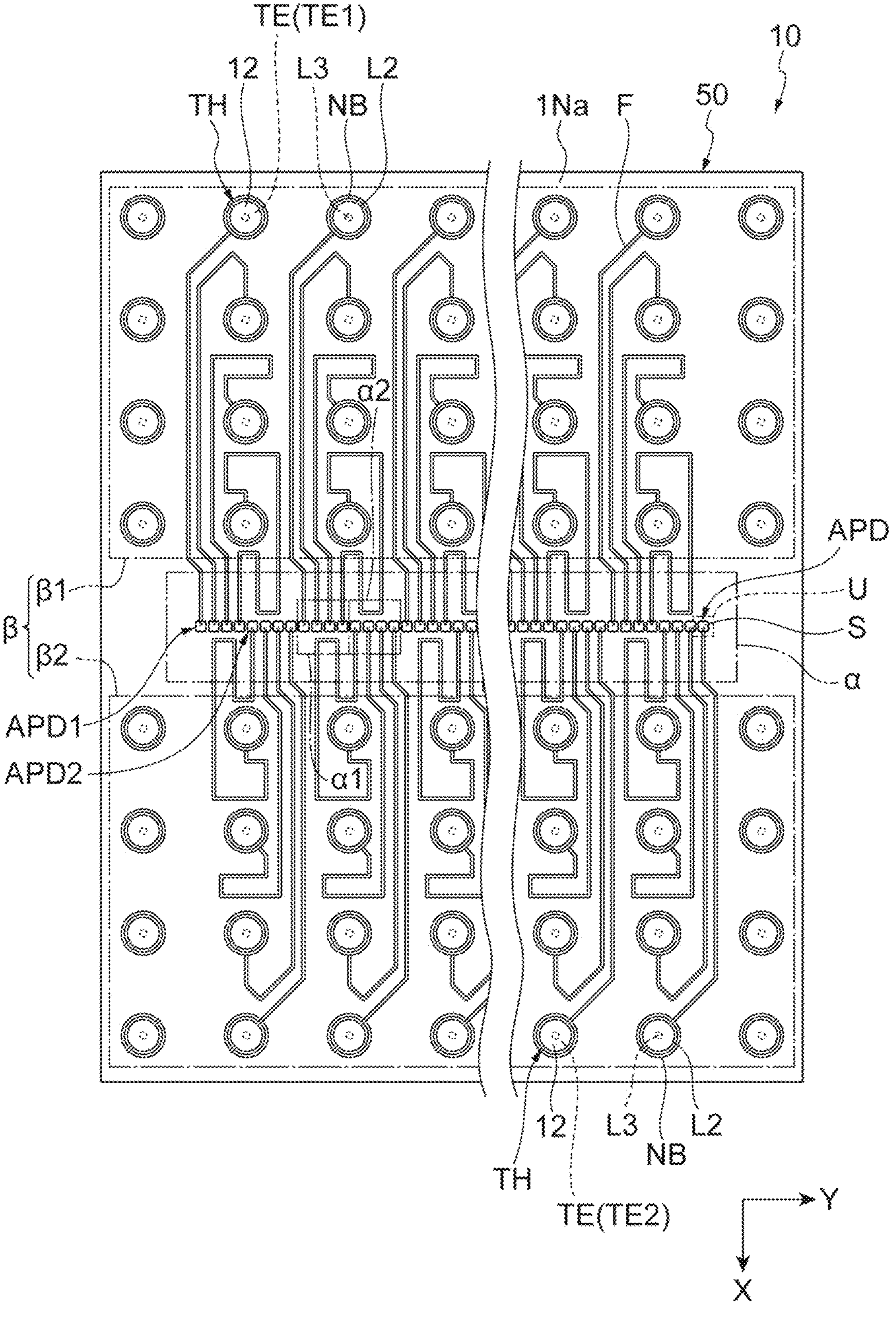
FIG. 6 is a schematic plan view illustrating a modification of a semiconductor photodetecting element.

In the semiconductor photodetecting element 10 as illustrated in FIG. 6, the lengths of the wirings F are equivalent. In which case, the equivalence of the lengths does not necessarily mean only that values are exactly equal. Even when the values include slight differences in a predetermined range, manufacturing errors, or the like, the lengths may be considered to be equivalent. Each length of the plurality of wirings F is, for example, 0.42 mm.

The signal reading-time deviation between the plurality of avalanche photodiodes APD is extremely small. Therefore, according to the present modification, it is easy to perform processing in a stage downstream of the photodetecting device 1.

Figure 7:
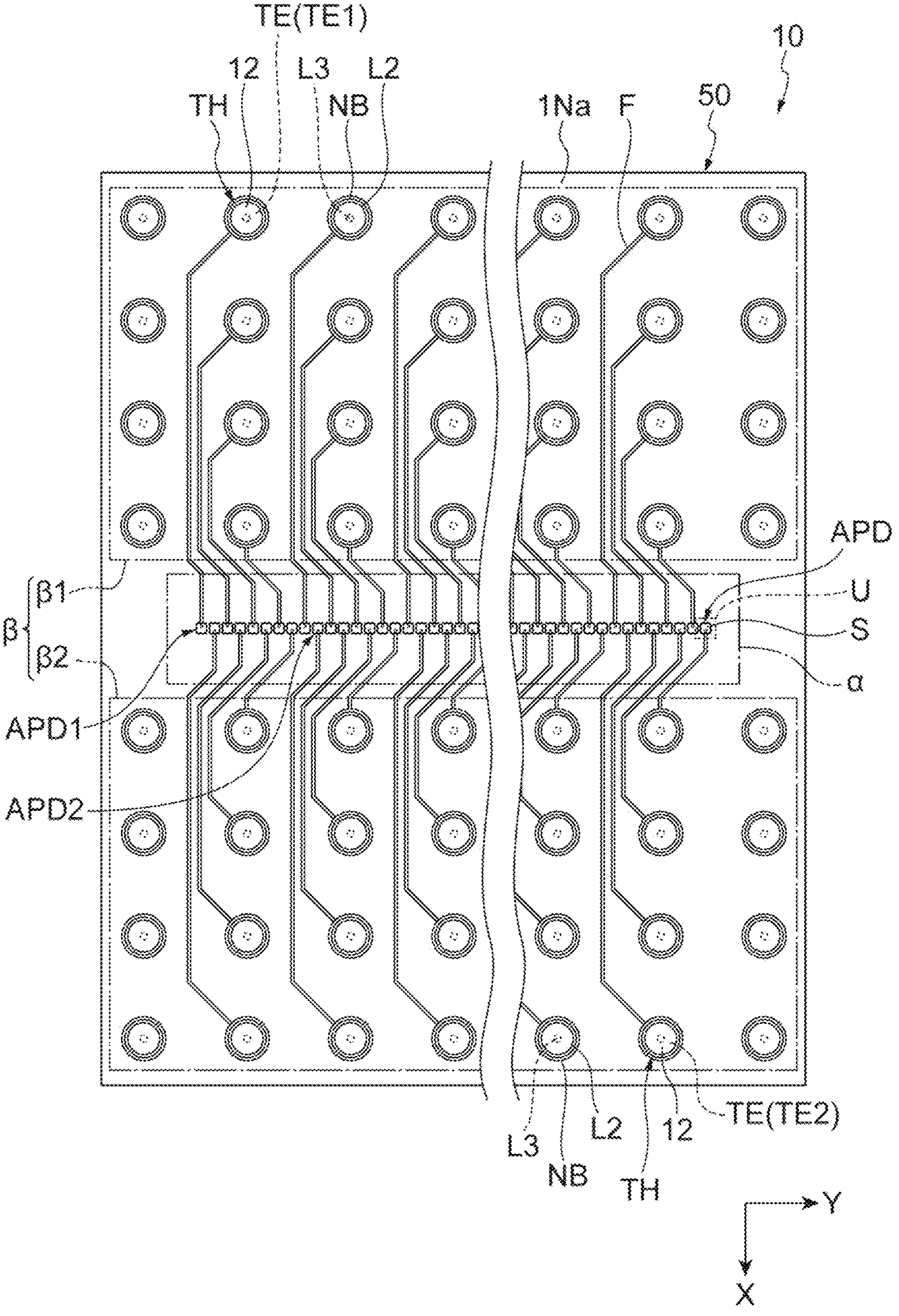
FIG. 7 is a schematic plan view illustrating a modification of a semiconductor photodetecting element.

In the semiconductor photodetecting element 10 as illustrated in FIG. 7, the avalanche photodiodes APD electrically connected to the through-electrode TE1 and the avalanche photodiodes APD electrically connected to the through-electrode TE2 are alternately distributed in the Y axis direction.

In the semiconductor photodetecting element 10 as illustrated in FIG. 7, the distance between the wirings F is wider in the Y axis direction, so that the arrangement density of the wirings F decreases. Therefore, even when the pitch of the avalanche photodiodes APD (pixels U) is even smaller, the generation of parasitic capacitance between the wirings F is suppressed. Consequently, according to the present modification, the photodetecting device 1 in which the photodetection accuracy is ensured and the photodetection resolution is further improved is provided.

Figure 8:
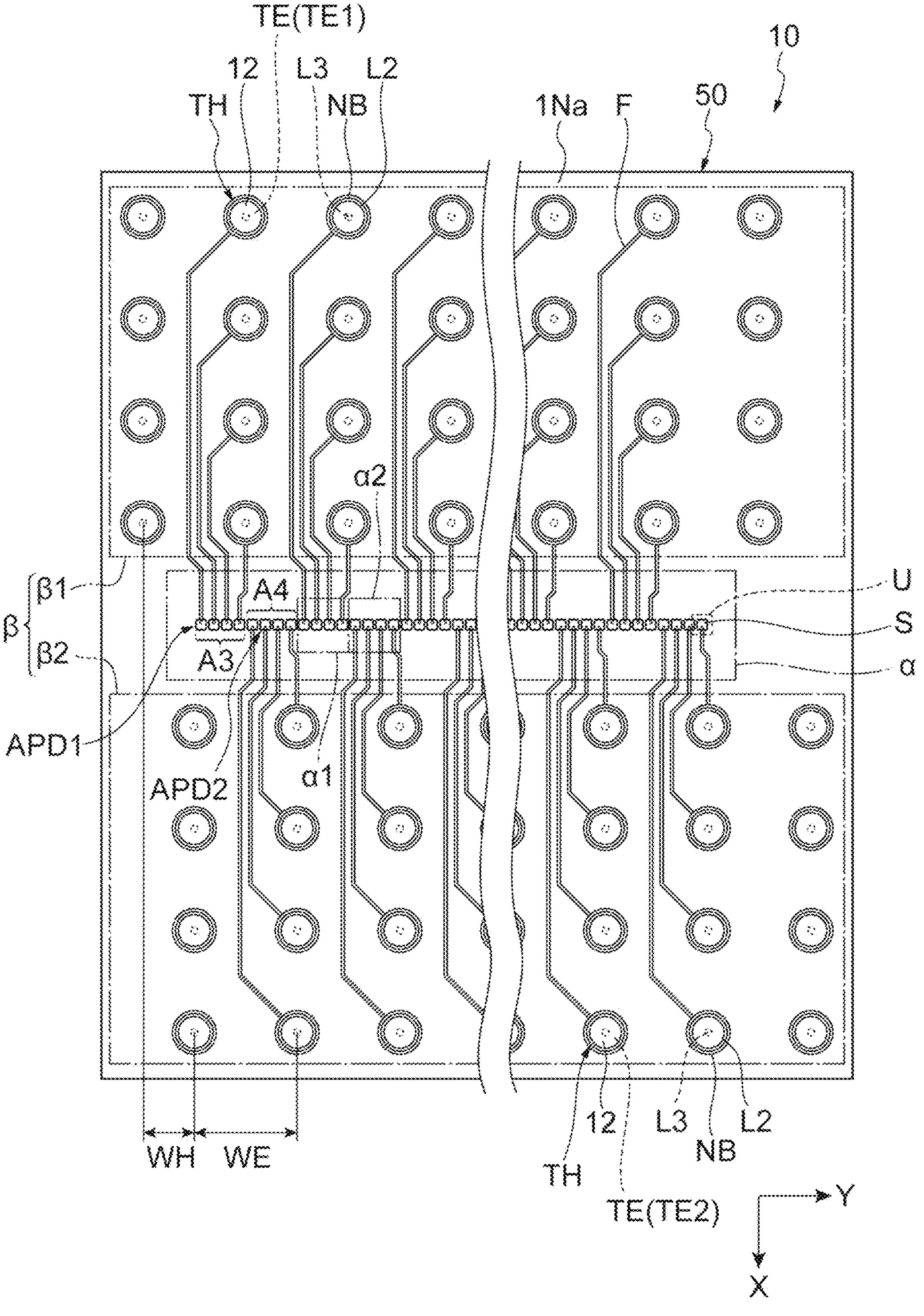
FIG. 8 is a schematic plan view illustrating a modification of a semiconductor photodetecting element.

Like the semiconductor photodetecting element 10 as illustrated in FIG. 2, the semiconductor photodetecting element 10 as illustrated in FIG. 8 is configured in such a manner that, in each of the areas β1 and β2, the plurality of through-electrodes TE are distributed in a matrix when viewed from the Z axis direction. A pitch WE1 in the row direction of the through-electrode TE and a pitch WE2 in the column direction of the through-electrode TE are the same as each other. Each of the pitch WE1 and the pitch WE2 is, for example, 100 μm. In the present modification, the columns in which the plurality of through-electrodes TE1 are distributed and the columns in which the plurality of through-electrodes TE2 are distributed deviate from each other in the Y axis direction. The deviation in the Y axis direction between the columns in which the plurality of through-electrodes TE1 are distributed and the columns in which the plurality of through-electrodes TE2 are distributed is, for example, half of the pitch WE1.

In the semiconductor photodetecting element 10 as illustrated in FIG. 8, the plurality of avalanche photodiodes APD include the plurality of avalanche photodiodes APD1 and the plurality of avalanche photodiodes APD2, and the first area α includes an area α1 and an area α2. A plurality of avalanche photodiodes APD1 located in any given area α1 forms one avalanche photodiode group A3. A plurality of avalanche photodiodes APD2 located in any given area α2 forms one avalanche photodiode group A4. Each of the plurality of avalanche photodiodes APD1 is electrically connected to the corresponding through-electrode TE1. Each of the plurality of avalanche photodiodes APD2 is electrically connected to the corresponding through-electrode TE2.

In any given avalanche photodiode group A3 (any given area α1), an avalanche photodiode APD1 closer to one end of the first area α in the Y axis direction is electrically connected to a through-electrode TE1 farther from the first area α (area α1). In other words, in any given avalanche photodiode group A3, the closer to the one end of the first area α in the Y axis direction a given avalanche photodiode APD1 is located, the farther from the first area α (area α1) the through-electrode TE1 to which the given avalanche photodiode APD1 is electrically connected. In any given avalanche photodiode group A4 (any given area α2), an avalanche photodiode APD2 closer to one end of the first area α in the Y axis direction is electrically connected to a through-electrode TE2 farther from the first area α (area α2). In other words, in any given avalanche photodiode group A4, the closer to the one end of the first area α in the Y axis direction a given avalanche photodiode APD2 is located, the farther from the first area α (area α2) the through-electrode TE2 to which the given avalanche photodiode APD2 is electrically connected.

A change of the length of the wiring F between the avalanche photodiode APD1 and the through-electrode TE1 in accordance with the position of the avalanche photodiode APD1 in the Y axis direction and a change of the length of the wiring F between the avalanche photodiode APD2 and the through-electrode TE2 in accordance with the position of the avalanche photodiode APD2 in the Y axis direction are similar to each other. Therefore, in the present modification, when the signals from the avalanche photodiodes APD are read in order in the Y axis direction, this will make it easy to perform processing in a stage downstream of the photodetecting device 1.

Figure 9:
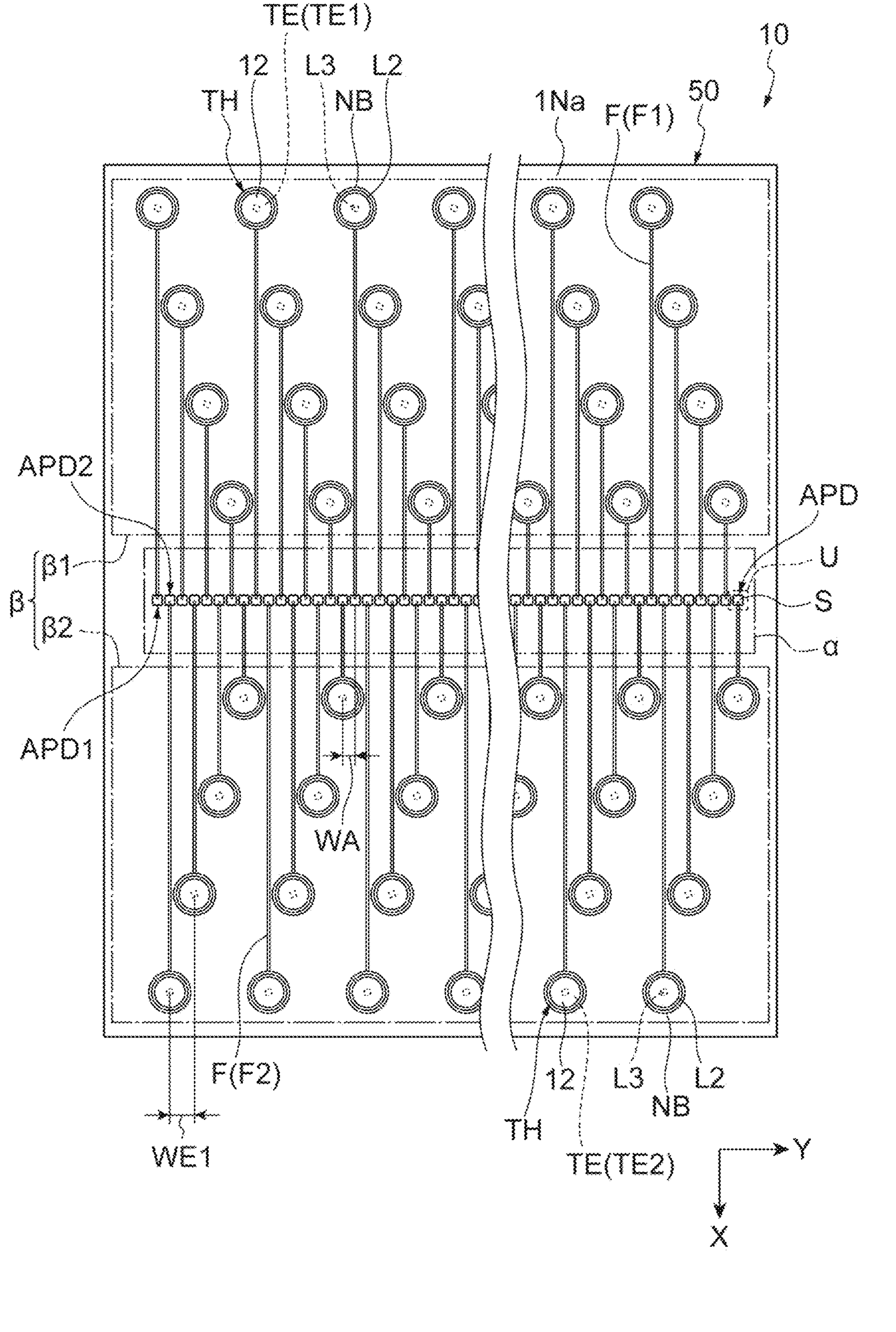
FIG. 9 is a schematic plan view illustrating a modification of a semiconductor photodetecting element.

In the semiconductor photodetecting element 10 illustrated in FIG. 9, the wirings F are formed in a straight line form. The plurality of wirings F include a plurality of wirings F1 in a straight line form and a plurality of wirings F2 in a straight line form. Each of the plurality of wirings F1 electrically connects the corresponding through-electrode TE1 and the corresponding avalanche photodiode APD1 with each other. Each of the plurality of wirings F2 electrically connects the corresponding through-electrode TE2 and the corresponding avalanche photodiode APD2 with each other. The pitch WE1 is, for example, 100 μm.

In the semiconductor photodetecting element 10 as illustrated in FIG. 9, the avalanche photodiodes APD1 electrically connected to the wirings F1 and the avalanche photodiodes APD2 electrically connected to the wirings F2 are alternately distributed in the Y axis direction. The pitch WA is equal to or less than ½ of the pitch WE1. These configurations ensure the area where the through-electrodes TE (TE1 and TE2) are provided. The pitch WA is, for example, 50 μm.

The distance between wirings F1 in the Y axis direction is increased and the distance between wirings F2 in the Y axis direction is also increased, and therefore, each of the arrangement densities of the wirings F1 and the wirings F2 decreases. Therefore, even when the pitch of the avalanche photodiodes APD (pixels U) is even smaller, the generation of parasitic capacitance between the adjacent wirings F is suppressed. Consequently, according to the present modification, the photodetecting device 1 in which the photodetection accuracy is ensured and the photodetection resolution is further improved is provided.

Figure 10:
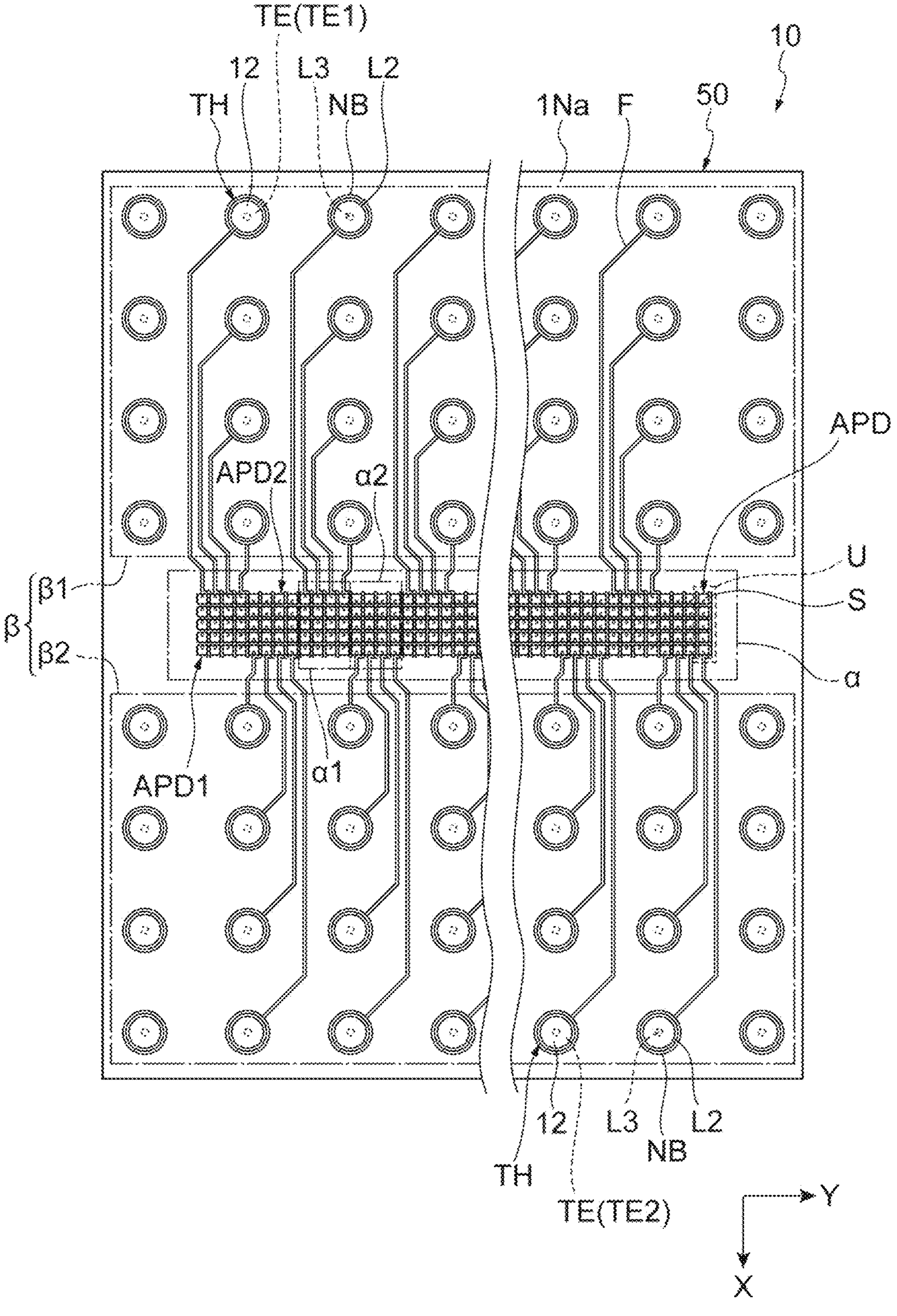
FIG. 10 is a schematic plan view illustrating a modification of a semiconductor photodetecting element.

In the semiconductor photodetecting element 10 as illustrated in FIG. 10, the first area α has a rectangular shape of which longitudinal direction is in the Y axis direction. In the first area α, the plurality of avalanche photodiodes APD are two-dimensionally distributed. The avalanche photodiodes APD of the semiconductor photodetecting element 10 as illustrated in FIG. 2 are distributed in a line, whereas five columns of avalanche photodiodes APD of the semiconductor photodetecting element 10 as illustrated in FIG. 10 are distributed in the X-axis direction.

Figure 12:
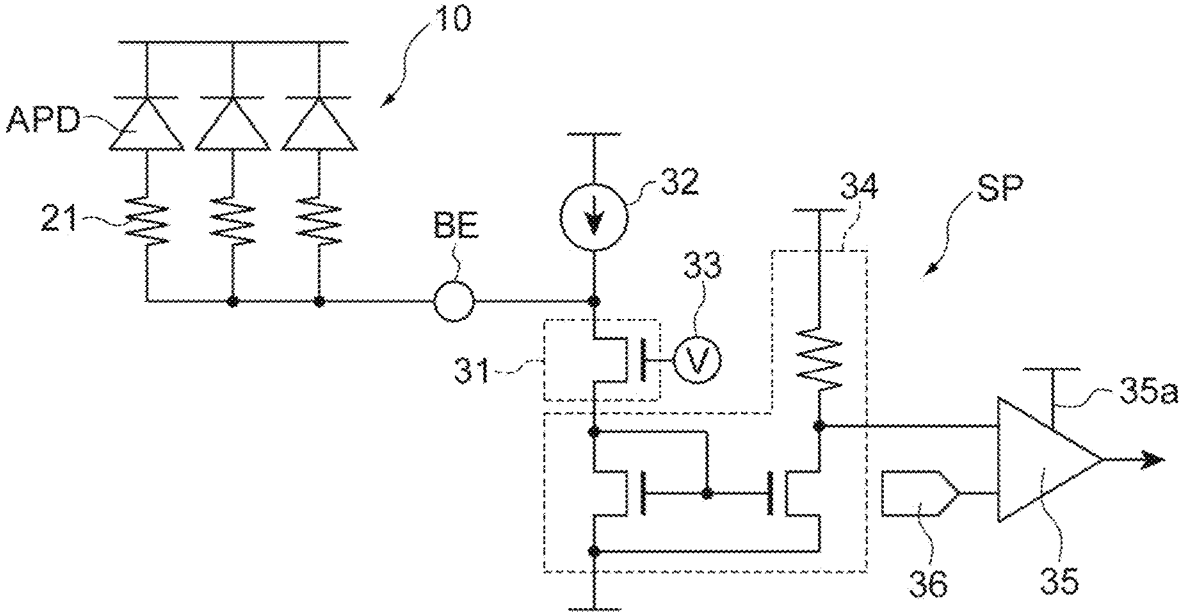
FIG. 12 is a circuit diagram of a photodetecting device according to a modification of the present embodiment.

In the semiconductor photodetecting element 10 as illustrated in FIG. 10, each of a plurality of avalanche photodiodes APD is electrically connected to a different through-electrode TE (TE1 or TE2) in accordance with a position in the Y axis direction. In the semiconductor photodetecting element 10 as illustrated in FIG. 10, the plurality of avalanche photodiodes APD (APD1 or APD2) distributed in a line in the X-axis direction form one pixel U. In the present modification, five avalanche photodiodes APD form one pixel U. Each of the plurality of avalanche photodiodes APD constituting one pixel U is electrically connected to a single through-electrode TE (TE1 or TE2). A signal from one pixel U is led through one wiring F to a single through-electrode TE (TE1 or TE2). The photodetecting device 1 may include a circuit as illustrated in FIG. 12. FIG. 12 illustrates only the circuit for a single pixel U. The photodetecting device 1 includes as many circuits as the number of pixels U.

In the circuit as illustrated in FIG. 12, a plurality of quenching resistors 21 are disposed in the semiconductor photodetecting element 10. The plurality of quenching resistors 21 are electrically connected in series to the corresponding avalanche photodiode APD. The plurality of quenching resistors 21 electrically connected to the plurality of avalanche photodiodes APD constituting one pixel U are electrically connected in parallel to one bump electrode BE (one through-electrode). FIG. 12 illustrates only three avalanche photodiodes APD of the plurality of avalanche photodiodes APD. The remaining avalanche photodiodes APD are not illustrated in FIG. 12.

The bump electrode BE is electrically connected to the signal processing unit SP. The signal processing unit SP includes a gate grounding circuit 31, a current mirror circuit 34, and a comparator 35. The gate grounding circuit 31 includes an FET (Field Effect Transistor). The bump electrode BE (through-electrode TE) is electrically connected to a drain of the FET. A constant current source 32 is also electrically connected to the drain of the FET. The bump electrode BE and the constant current source 32 are electrically connected in parallel to the drain. A voltage source 33 is electrically connected to a gate of the FET. An input terminal of the current mirror circuit 34 is electrically connected to a source of the FET.

One of input terminals of the comparator 35 is electrically connected to the output terminal of the current mirror circuit 34. A variable voltage source 36 is electrically connected to another of the input terminals of the comparator 35. A voltage source is electrically connected to a power supply terminal 35*a* of the comparator 35. In the circuit as illustrated in FIG. 12, a digital signal corresponding to the output signal of the plurality of avalanche photodiodes APD constituting one pixel U is output from an output terminal of the comparator 35.

Even in the semiconductor photodetecting element 10 as illustrated in FIG. 10, the circuit of the photodetecting device 1 may include a quenching resistor 21 and an inverter 22 as illustrated in FIG. 5 and FIG. 11. The quenching resistor 21 and the inverter 22 are electrically connected in parallel to a bump electrode BE (through-electrode TE).

In the semiconductor photodetecting element 10 as illustrated in FIG. 10, the plurality of avalanche photodiodes APD distributed in a line in the X-axis direction form one pixel U. Each pixel U formed by the plurality of avalanche photodiodes APD extends in the X-axis direction, so that the photosensitivity of each pixel U is improved. Therefore, according to the present modification, the photodetection resolution in the Y axis direction is further improved.

Although the preferred embodiments and modifications of the present invention have been described above, the present invention is not necessarily limited to the above-described embodiments and modifications, and various modifications can be made without departing from the gist thereof.

The photodetecting device 1 was described as including the semiconductor photodetecting element 10, the mounting substrate 20, and the glass substrate 30, but in some examples the photodetecting device 1 may not include the mounting substrate 20 and the glass substrate 30.

The pitch WE1 in the row direction of the through-electrode TE and the pitch WE2 in the column direction of the through-electrode TE were described as being the same as each other, but in some examples the pitch WE1 and the pitch WE2 may be different from each other.

The plurality of through-electrodes TE were described as being provided in both the area β1 and the area β2, but in some examples the plurality of through-electrodes TE may be provided in only one of the area β1 and the area β2.

In the above-described embodiments and modifications, a single avalanche photodiode APD forms one pixel U. When a plurality of pixels U are distributed in a line in the Y axis direction, for example, the plurality of avalanche photodiodes APD adjacent to each other in the Y axis direction may form a single pixel U. In the semiconductor photodetecting element 10 as illustrated in FIG. 10, the plurality of avalanche photodiodes APD included in columns adjacent to each other in the Y axis direction may form one pixel U. For example, "10" avalanche photodiodes APD included in two columns adjacent to each other in the Y axis direction may form a single pixel U. Even in this case, all the avalanche photodiodes APD included in the same pixel U are electrically connected to the same through-electrode TE.

The circuit of the photodetecting device 1 is not limited to the circuit illustrated in FIG. 5, FIG. 11, or FIG. 12. For example, the circuits illustrated in FIG. 5 and FIG. 11 may include a comparator or a logic circuit (for example, AND circuit, NAND circuit, or OR circuit) instead of the inverter 22. For example, the circuit illustrated in FIG. 12 may include an inverter 22 electrically connected in series to a bump electrode BE (through-electrode TE) instead of the gate grounding circuit 31, the current mirror circuit 34, the comparator 35, and the like.

INDUSTRIAL APPLICABILITY

The present invention can be used for a photodetecting device to detect weak light.

REFERENCE SIGNS LIST

1 photodetecting device
10 semiconductor photodetecting element
20 mounting substrate
21 quenching resistor
50 semiconductor substrate
1Na, 1Nb principal surface
α first area
α1, α2 areas included in first area
β second area
β1, β2 area included in second area
APD, APD1, APD2 avalanche photodiode
A1, A2, A3, A4 avalanche photodiode group
BE bump electrode
D diameter of opening of through-hole
F, F1, F2 wiring
WE1, WE2 pitch of through-electrode
TE through-electrode
TH through-hole.

The invention claimed is:

1. A photodetecting device comprising:

a semiconductor substrate including a first principal surface and a second principal surface that oppose each other, and including a plurality of avalanche photodiodes arranged to operate in Geiger mode; and a plurality of through-electrodes electrically connected to corresponding avalanche photodiodes of the plurality of avalanche photodiodes and penetrating through the semiconductor substrate in a thickness direction, wherein the semiconductor substrate includes:

a first area in which the plurality of avalanche photodiodes are distributed in at least a first direction; and a second area in which the plurality of through-electrodes are distributed two-dimensionally and the plurality of avalanche photodiodes are not distributed, and wherein the first area and the second area are distributed in a second direction orthogonal to the first direction when viewed from a direction orthogonal to the first principal surface.

2. The photodetecting device according to claim 1, wherein avalanche photodiodes of the plurality of avalanche photodiodes whose positions in the first direction are different from each other are electrically connected to through-electrodes different from each other.

3. The photodetecting device according to claim 2, wherein the first area has a rectangular shape of which a longitudinal direction is in the first direction, and the plurality of avalanche photodiodes are distributed two-dimensionally in the first area.

4. The photodetecting device according to claim 3, wherein a plurality of the avalanche photodiodes form a plurality of pixels distributed in a line in the first direction, and the plurality of avalanche photodiodes included in the same pixel are electrically connected to the same through-electrode.

5. The photodetecting device according to claim 1, wherein the plurality of avalanche photodiodes are distributed in a line in the first direction.

6. The photodetecting device according to claim 1, wherein the semiconductor substrate is formed with a plurality of through-holes in which the plurality of through-electrodes are provided, and a pitch of the avalanche photodiodes is smaller than a diameter of an opening of the through-holes at the first principal surface.

7. The photodetecting device according to claim 1, wherein the second area includes a third area and a fourth area spaced apart from each other in the second direction, the first area is located between the third area and the fourth area, and the plurality of through-electrodes includes a plurality of first through-electrodes located in the third area and a plurality of second through-electrodes located in the fourth area.

8. The photodetecting device according to claim 7, wherein the plurality of first through-electrodes is distributed in a matrix in which the first direction is a row direction and the second direction is a column direction when viewed from a direction orthogonal to the first principal surface, the plurality of second through-electrodes are distributed in a matrix in which the first direction is a row direction and the second direction is a column direction when viewed from a direction orthogonal to the first principal surface, and a column of the plurality of first through-electrodes and a column of the plurality of second through-electrodes are located on a straight line.

9. The photodetecting device according to claim 8, wherein the first area includes a fifth area and a sixth area adjacent to each other in the first direction, the plurality of avalanche photodiodes include a plurality of first avalanche photodiodes located in the fifth area and a plurality of second avalanche photodiodes located in the sixth area, the plurality of first through-electrodes and the plurality of second through-electrodes distributed on the straight line are electrically connected to the plurality of first avalanche photodiodes and the plurality of second avalanche photodiodes, respectively, the first avalanche photodiode closer to one end of the first area in the first direction is electrically connected to the first through-electrode farther from the first area, and the second avalanche photodiode closer to the one end in the first direction is electrically connected to the second through-electrode closer to the first area.

10. The photodetecting device according to claim 7, wherein the avalanche photodiode electrically connected to the first through-electrode and the avalanche photodiode electrically connected to the second through-electrode are distributed alternately in the first direction.

11. The photodetecting device according to claim 7, wherein the plurality of first through-electrodes are distributed in a matrix in which the first direction is a row direction and the second direction is a column direction when viewed from a direction orthogonal to the first principal surface, the plurality of second through-electrodes are distributed in a matrix in which the first direction is a row direction and the second direction is a column direction when viewed from a direction orthogonal to the first principal surface, the first area includes a fifth area and a sixth area adjacent to each other in the first direction, and the plurality of avalanche photodiodes includes a plurality of first avalanche photodiodes located in the fifth area and a plurality of second avalanche photodiodes located in the sixth area, the plurality of first avalanche photodiodes are each electrically connected to a plurality of first through-electrodes distributed in the column direction, and are arranged such that the first avalanche photodiode closer to one end of the first area in the first direction is electrically connected to the first through-electrode farther from the first area, and the plurality of second avalanche photodiodes are each electrically connected to a plurality of second through-electrodes distributed in the column direction, and are arranged such that the second avalanche photodiode closer to the one end in the first direction is electrically connected to the second through-electrode farther from the first area.

12. The photodetecting device according to claim 7, further comprising:

a plurality of first wirings in a straight line form electrically connecting the plurality of first through-electrodes and the corresponding avalanche photodiodes; and a plurality of second wirings in a straight line form electrically connecting the plurality of second through-electrodes and the corresponding avalanche photodiodes, wherein a pitch in the first direction of the plurality of first through-electrodes and a pitch in the first direction of the plurality of second through-electrodes are a predetermined value, the pitch in the first direction of the plurality of avalanche photodiodes is equal to or less than ½ of the predetermined value, and the avalanche photodiode electrically connected to the first through-electrode and the avalanche photodiode electrically connected to the second through-electrode are alternately distributed.

13. The photodetecting device according to claim 1, further comprising a plurality of wirings connecting the plurality of through-electrodes and the plurality of avalanche photodiodes, wherein the lengths of the plurality of wirings are equivalent.

14. The photodetecting device according to claim 1, further comprising:

a mounting substrate opposing the second principal surface of the semiconductor substrate; and a plurality of bump electrodes, wherein the mounting substrate is electrically connected to the plurality of through-electrodes through the corresponding bump electrodes.

15. The photodetecting device according to claim 1, further comprising a mounting substrate opposing the second principal surface of the semiconductor substrate, wherein the mounting substrate includes a plurality of quenching circuits, and the plurality of avalanche photodiodes are electrically connected to the corresponding quenching circuits.

16. A photodetecting device comprising:

a semiconductor substrate including a first principal surface and a second principal surface that oppose each other, and including a plurality of avalanche photodiodes arranged to operate in Geiger mode; and a plurality of through-electrodes electrically connected to corresponding avalanche photodiodes of the plurality of avalanche photodiodes and penetrating through the semiconductor substrate in a thickness direction, wherein the semiconductor substrate includes:

a first area in which the plurality of avalanche photodiodes are distributed in at least a first direction; and a second area in which the plurality of through-electrodes are distributed two-dimensionally, and wherein the first area and the second area are distributed in a second direction orthogonal to the first direction and do not overlap each other, when viewed from a direction orthogonal to the first principal surface.

17. The photodetecting device according to claim 16, wherein avalanche photodiodes of the plurality of avalanche photodiodes whose positions in the first direction are different from each other are electrically connected to through-electrodes different from each other.

18. The photodetecting device according to claim 17, wherein the first area has a rectangular shape of which a longitudinal direction is in the first direction, and the plurality of avalanche photodiodes are distributed two-dimensionally in the first area.

19. The photodetecting device according to claim 18, wherein a plurality of the avalanche photodiodes form a plurality of pixels distributed in a line in the first direction, and the plurality of avalanche photodiodes included in the same pixel are electrically connected to the same through-electrode.

20. The photodetecting device according to claim 16, wherein the plurality of avalanche photodiodes are distributed in a line in the first direction.

21. The photodetecting device according to claim 16, wherein the semiconductor substrate is formed with a plurality of through-holes in which the plurality of through-electrodes are provided, and a pitch of the avalanche photodiodes is smaller than a diameter of an opening of the through-holes at the first principal surface.

22. The photodetecting device according to claim 16, wherein the second area includes a third area and a fourth area spaced apart from each other in the second direction, the first area is located between the third area and the fourth area, and the plurality of through-electrodes includes a plurality of first through-electrodes located in the third area and a plurality of second through-electrodes located in the fourth area.

23. The photodetecting device according to claim 22, wherein the plurality of first through-electrodes is distributed in a matrix in which the first direction is a row direction and the second direction is a column direction when viewed from a direction orthogonal to the first principal surface, the plurality of second through-electrodes are distributed in a matrix in which the first direction is a row direction and the second direction is a column direction when viewed from a direction orthogonal to the first principal surface, and a column of the plurality of first through-electrodes and a column of the plurality of second through-electrodes are located on a straight line.

24. The photodetecting device according to claim 23, wherein the first area includes a fifth area and a sixth area adjacent to each other in the first direction, the plurality of avalanche photodiodes include a plurality of first avalanche photodiodes located in the fifth area and a plurality of second avalanche photodiodes located in the sixth area, the plurality of first through-electrodes and the plurality of second through-electrodes distributed on the straight line are electrically connected to the plurality of first avalanche photodiodes and the plurality of second avalanche photodiodes, respectively, the first avalanche photodiode closer to one end of the first area in the first direction is electrically connected to the first through-electrode farther from the first area, and the second avalanche photodiode closer to the one end in the first direction is electrically connected to the second through-electrode closer to the first area.

25. The photodetecting device according to claim 22, wherein the avalanche photodiode electrically connected to the first through-electrode and the avalanche photodiode electrically connected to the second through-electrode are distributed alternately in the first direction.

26. The photodetecting device according to claim 22, wherein the plurality of first through-electrodes are distributed in a matrix in which the first direction is a row direction and the second direction is a column direction when viewed from a direction orthogonal to the first principal surface, the plurality of second through-electrodes are distributed in a matrix in which the first direction is a row direction and the second direction is a column direction when viewed from a direction orthogonal to the first principal surface, the first area includes a fifth area and a sixth area adjacent to each other in the first direction, and the plurality of avalanche photodiodes includes a plurality of first avalanche photodiodes located in the fifth area and a plurality of second avalanche photodiodes located in the sixth area, the plurality of first avalanche photodiodes are each electrically connected to a plurality of first through-electrodes distributed in the column direction, and are arranged such that the first avalanche photodiode closer to one end of the first area in the first direction is electrically connected to the first through-electrode farther from the first area, and the plurality of second avalanche photodiodes are each electrically connected to a plurality of second through-electrodes distributed in the column direction, and are arranged such that the second avalanche photodiode closer to the one end in the first direction is electrically connected to the second through-electrode farther from the first area.

27. The photodetecting device according to claim 22, further comprising:

a plurality of first wirings in a straight line form electrically connecting the plurality of first through-electrodes and the corresponding avalanche photodiodes; and a plurality of second wirings in a straight line form electrically connecting the plurality of second through-electrodes and the corresponding avalanche photodiodes, wherein a pitch in the first direction of the plurality of first through-electrodes and a pitch in the first direction of the plurality of second through-electrodes are a predetermined value, the pitch in the first direction of the plurality of avalanche photodiodes is equal to or less than ½ of the predetermined value, and the avalanche photodiode electrically connected to the first through-electrode and the avalanche photodiode electrically connected to the second through-electrode are alternately distributed.

28. The photodetecting device according to claim 16, further comprising a plurality of wirings connecting the plurality of through-electrodes and the plurality of avalanche photodiodes, wherein the lengths of the plurality of wirings are equivalent.

29. The photodetecting device according to claim 16, further comprising:

a mounting substrate opposing the second principal surface of the semiconductor substrate; and a plurality of bump electrodes, wherein the mounting substrate is electrically connected to the plurality of through-electrodes through the corresponding bump electrodes.

30. The photodetecting device according to claim 16, further comprising a mounting substrate opposing the second principal surface of the semiconductor substrate, wherein the mounting substrate includes a plurality of quenching circuits, and the plurality of avalanche photodiodes are electrically connected to the corresponding quenching circuits.

* * * * *